US012725062B2

(12) United States Patent
Yasuda et al.

(10) Patent No.: US 12,725,062 B2
(45) Date of Patent: Sep. 1, 2026

(54) EFFECTIVE SYNCHRONOUS GATES FOR RAPID SINGLE FLUX QUANTUM LOGIC

(71) Applicant: International Business Machines Corporation, Armonk, NY (US)

(72) Inventors: Takeo Yasuda, Nara (JP); Robert K. Montoye, Yorktown Heights, NY (US); Gerald W. Gibson, Danbury, CT (US); Sergey Rylov, White Plains, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 656 days.

(21) Appl. No.: 17/733,977

(22) Filed: Apr. 29, 2022

(65) Prior Publication Data

US 2023/0351234 A1 Nov. 2, 2023

(51) Int. Cl.
*G06N 10/20* (2022.01)
*G06N 10/40* (2022.01)
(Continued)

(52) U.S. Cl.
CPC ............. *G06N 10/20* (2022.01); *G06N 10/40* (2022.01); *H03K 19/096* (2013.01); *H03K 19/195* (2013.01)

(58) Field of Classification Search
CPC ...... G06N 10/20; G06N 10/40; H03K 19/096; H03K 19/195
(Continued)

(56) References Cited

U.S. PATENT DOCUMENTS

| | | | |
|---|---|---|---|
| 5,077,686 | A | 12/1991 | Rubinstein |
| 5,371,417 | A | 12/1994 | Mirov et al. |

(Continued)

FOREIGN PATENT DOCUMENTS

| | | | |
|---|---|---|---|
| JP | 3936889 | B2 | 6/2007 |
| JP | 4402136 | B2 | 1/2010 |
| WO | 2004/102628 | A2 | 11/2004 |

OTHER PUBLICATIONS

Volkmann et al (Year: 2015) : IEEE Transactions on Applied Superconductivity, vol. 25, No. 3, Jun. 2015.*

(Continued)

*Primary Examiner* — Arnold M Kinkead
(74) *Attorney, Agent, or Firm* — Amin, Turocy & Watson, LLP

(57) ABSTRACT

A superconducting multi-stage synchronous logic circuit structure includes a first clocked logic gate, a second clocked logic gate, and an unclocked logic gate. Each of the logic gates includes Josephson junctions. The first clocked logic gate has a single first clocked logic gate output; the second clocked logic gate has a single second clocked logic gate output. The unclocked logic gate has a first input connected in electrical communication with the first clocked logic gate output and has a second input connected in electrical communication with the second clocked logic gate output, and has a single output. The Josephson junctions of the unclocked logic gate are arranged such that, in a single clock cycle that drives the first clocked logic gate and the second clocked logic gate, the unclocked logic gate produces a single signal in response to the inputs of the first and second clocked logic gates.

18 Claims, 17 Drawing Sheets

(51) Int. Cl.
*H03K 19/096* (2006.01)
*H03K 19/195* (2006.01)

(58) Field of Classification Search
USPC ....................... 326/3; 341/155; 327/295, 367
See application file for complete search history.

(56) References Cited

U.S. PATENT DOCUMENTS

| | | | |
|---|---|---|---|
| 6,281,728 | B1 | 8/2001 | Sung |
| 6,404,247 | B1 | 6/2002 | Wang |
| 6,750,794 | B1 | 6/2004 | Durand et al. |
| 6,759,974 | B1 | 7/2004 | Herr |
| 6,922,066 | B2 | 7/2005 | Hidaka |
| 7,786,786 | B2 | 8/2010 | Kirichenko |
| 8,023,605 | B2 | 9/2011 | Tsukamoto et al. |
| 8,250,395 | B2 | 8/2012 | Carter et al. |
| 8,327,158 | B2 | 12/2012 | Titiano et al. |
| 8,476,962 | B2 | 7/2013 | Pelley |
| 8,516,426 | B2 | 8/2013 | Bose et al. |
| 9,646,682 | B1 | 5/2017 | Miller et al. |
| 9,710,586 | B2 | 7/2017 | Muller et al. |
| 9,733,978 | B2 | 8/2017 | Suarez et al. |
| 9,876,505 | B1 | 1/2018 | Dai et al. |
| 9,998,122 | B2 | 6/2018 | Hamilton |
| 10,069,410 | B1 | 9/2018 | Chang et al. |
| 10,222,416 | B1 | 3/2019 | Amol |
| 10,529,437 | B2 | 1/2020 | Jang et al. |
| 10,599,481 | B2 | 3/2020 | Pistol et al. |
| 10,651,808 | B2 | 5/2020 | Egan et al. |
| 10,658,335 | B2 | 5/2020 | Gu et al. |
| 10,680,617 | B2 | 6/2020 | Rylov |
| 10,726,351 | B1 | 7/2020 | Li et al. |
| 10,795,853 | B2 | 10/2020 | Nassif et al. |
| 10,950,299 | B1 | 3/2021 | Mukhanov |
| 11,137,822 | B2 | 10/2021 | Gelman et al. |
| 12,294,369 | B2 | 5/2025 | Yasuda et al. |
| 2002/0060635 | A1 | 5/2002 | Gupta |
| 2003/0016069 | A1 | 1/2003 | Furuta et al. |
| 2004/0042255 | A1 | 3/2004 | Labrum et al. |
| 2004/0179421 | A1 | 9/2004 | Kim et al. |
| 2005/0036254 | A1 | 2/2005 | Premerlani et al. |
| 2005/0047245 | A1 | 3/2005 | Furuta et al. |
| 2005/0270870 | A1 | 12/2005 | Shin et al. |
| 2006/0288196 | A1 | 12/2006 | Unsal et al. |
| 2006/0290553 | A1 | 12/2006 | Furuta et al. |
| 2007/0064135 | A1 | 3/2007 | Brown et al. |
| 2009/0160492 | A1 | 6/2009 | Hailu et al. |
| 2010/0127679 | A1 | 5/2010 | Satterfield |
| 2010/0229034 | A1 | 9/2010 | Kanaya et al. |
| 2010/0295584 | A1 | 11/2010 | Sano |
| 2012/0007638 | A1 | 1/2012 | Meng et al. |
| 2013/0305078 | A1 | 11/2013 | Lee et al. |
| 2014/0266327 | A1 | 9/2014 | Ancis et al. |
| 2017/0097655 | A1 | 4/2017 | Jeon et al. |
| 2020/0044632 | A1 | 2/2020 | Powell et al. |
| 2021/0081209 | A1 | 3/2021 | Meswani et al. |
| 2021/0208803 | A1 | 7/2021 | Myers et al. |
| 2021/0226635 | A1 | 7/2021 | Mukhanov |
| 2021/0271288 | A1 | 9/2021 | Seo et al. |
| 2022/0021391 | A1 | 1/2022 | Pasandi et al. |
| 2022/0094339 | A1 | 3/2022 | Kim et al. |
| 2022/0255541 | A1 | 8/2022 | Zlotnik et al. |

OTHER PUBLICATIONS

T. Filippov et al., "8-bit asynchronous wave-pipelined RSFQ arithmetic-logic unit," IEEE Transactions On Applied Superconductivity, vol. 21, No. 3, 2011, pp. 847-851.

Timur V. Filippov et al., "20 GHz operation of an asynchronous wave-pipelined RSFQ arithmetic-logic unit," Physics Procedia, vol. 36, 2012, pp. 59-65.

Marc J. Feldman, "Josephson Junction Digital Circuits—Challenges and Opportunities." FED Report, Feb. 1998. pp. 1-22.

K.K. Likharev et al., "RSFQ Logic/Memory Family: A New Josephson-Junction Technology for Sub-Terahertz-Clock-Frequency Digital Systems." IEEE Transactions on Applied Superconductivity, vol. I, No. I, Mar. 1991. pp. 1-26.

NSA, "Superconducting Technology Assessment." Aug. 2005. pp. 1-257.

Nobutaka Kito et al. "Rapid Single-Flux-Quantum Truncated Multiplier Based on Bit-Level Processing." IEICE Trans. Electron., vol. E102-C, No. Jul. 7, 2019. pp. 607-611.

Akira Fujimaki, et al. "Large-scale integrated circuit design based on a Nb nine-layer structure for reconfigurable data-path processors." IEICE Trans> Electron., vol. E97-C, No. 3, Mar. 2014. PP. 157-165.

Kazuyoshi Takagi, et al., "Circuit description and design flow of superconducting SFQ logic circuits." IEICE Trans. Electron. vol. E97-C, No. 3, Mar. 2014. pp. 149-156.

J.E. Hirsch, "What is the speed of the supercurrent in superconductors?" arXiv:1605.09469v4, Jul. 2016. pp. 1-15.

Paul Bunyk, "RSFQ Subsystem for Petaflops-Scale Computing: "COOL-0"." SUNY Stony Brook, Jan. 1999. pp. 1-7.

Wittie L, Zinoviev DY, Sazaklis G, Likharev K. CNET: Design of an RSFQ switching network for petaflops-scale computing. IEEE transactions on applied superconductivity. Jun. 1999;9(2):4034-9.

O.A. Mukhanov, et al. "New elements of the RSFQ logic family." IEEE Trans. Magnetics, vol. 27, No. 2, Mar. 1991. p. 2436-2438.

Kirichenko DF, Mukhanov OA, Zinoviev DY. New elements of the RSFQ logic/memory family (part 1),. 3rd ISEC Extended Abstracts,(Glasgow, UK). Aug. 1991:196-9.

Jabbari T, Friedma EG, Kawa J. H-tree clock synthesis in RSFQ circuits. In2020 17th Biennial Baltic Electronics Conference (BEC) Oct. 6, 2020 (pp. 1-5). IEEE.

A. Osman, et al. "Simplified Josephson-junction fabrication process for reproducibly high-performance superconducting qubits." arXiv:2011.05230v1. Nov. 2020. pp. 1-6.

A. Chattopadhyay and Z. Zilic, "Flexible and Reconfigurable Mismatch-Tolerant Serial Clock Distribution Networks," in IEEE Transactions on Very Large Scale Integration (VLSI) Systems, Mar. 2012, pp. 523-536, vol. 20, No. 3, doi: 10.1109/TVLSI.2011.2104982.

C. Fourie, "Single Flux Quantum Circuit Technology and CAD overview," 2018 IEEE/ACM International Conference on Computer-Aided Design (ICCAD), 2018, pp. 1-6, doi: 10.1145/3240765.3243498.

G. Pasandi, A. Shafaei and M. Pedram, "SFQmap: A Technology Mapping Tool for Single Flux Quantum Logic Circuits," 2018 IEEE International Symposium on Circuits and Systems (ISCAS), 2018, pp. 1-5, doi: 10.1109/ISCAS.2018.8351603.

Johnson, Kevin, "Design and implementation of an asynchronous version of the MIPS R3000 microprocessor", Jan. 1994, Rochester Institute of Technology, 91 pages, (Year: 1994).

List of IBM Patents or Patent Applications Treated as Related, filed herewith, 2 pages.

Montoye, R.K., et al., Stacked, Reconfigurable Co-Regulation of Processing Units for Ultra-Wide DVFS, U.S. Appl. No. 17/729,638, filed Apr. 26, 2022, 76 pages.

P. Yuh, "A 512-bit shift register using compact two-phase single flux quantum clock generators with large margins and low power," in IEEE Transactions on Applied Superconductivity, Dec. 1993, pp. 3116-3118, vol. 3, No. 4, doi: 10.1109/77.251814.

* cited by examiner

1400

1402

1404

1406 d (in)

clk q (out)

1502

| a1 | a2 | b1 | b2 | z |
|---|---|---|---|---|
| 0 | 0 | 0 | 0 | 0 |
| 0 | 0 | 0 | 1 | 0 |
| 0 | 0 | 1 | 0 | 0 |
| 0 | 0 | 1 | 1 | 1 |
| 0 | 1 | 0 | 0 | 0 |
| 0 | 1 | 0 | 1 | 0 |
| 0 | 1 | 1 | 0 | 0 |
| 0 | 1 | 1 | 1 | 1 |
| 1 | 0 | 0 | 0 | 0 |
| 1 | 0 | 0 | 1 | 0 |
| 1 | 0 | 1 | 0 | 0 |
| 1 | 0 | 1 | 1 | 1 |
| 1 | 1 | 0 | 0 | 1 |
| 1 | 1 | 0 | 1 | 1 |
| 1 | 1 | 1 | 0 | 1 |
| 1 | 1 | 1 | 1 | 1 |

1504

| a1 | a2 | b1 | b2 | z |
|---|---|---|---|---|
| 0 | 0 | 0 | 0 | 0 |
| 0 | 0 | 0 | 1 | 1 |
| 0 | 0 | 1 | 0 | 1 |
| 0 | 0 | 1 | 1 | 1 |
| 0 | 1 | 0 | 0 | 0 |
| 0 | 1 | 0 | 1 | 1 |
| 0 | 1 | 1 | 0 | 1 |
| 0 | 1 | 1 | 1 | 1 |
| 1 | 0 | 0 | 0 | 0 |
| 1 | 0 | 0 | 1 | 1 |
| 1 | 0 | 1 | 0 | 1 |
| 1 | 0 | 1 | 1 | 1 |
| 1 | 1 | 0 | 0 | 1 |
| 1 | 1 | 0 | 1 | 1 |
| 1 | 1 | 1 | 0 | 1 |
| 1 | 1 | 1 | 1 | 1 |

1522

| a1 | a2 | b | z |
|---|---|---|---|
| 0 | 0 | 0 | 0 |
| 0 | 0 | 1 | 1 |
| 0 | 1 | 0 | 0 |
| 0 | 1 | 1 | 1 |
| 1 | 0 | 0 | 0 |
| 1 | 0 | 1 | 1 |
| 1 | 1 | 0 | 1 |
| 1 | 1 | 1 | 1 |

1514

| a1 | a2 | b | z |
|---|---|---|---|
| 0 | 0 | 0 | 1 |
| 0 | 0 | 1 | 0 |
| 0 | 1 | 0 | 1 |
| 0 | 1 | 1 | 0 |
| 1 | 0 | 0 | 1 |
| 1 | 0 | 1 | 0 |
| 1 | 1 | 0 | 1 |
| 1 | 1 | 1 | 1 |

1516

| a1 | a2 | b | z |
|---|---|---|---|
| 0 | 0 | 0 | 1 |
| 0 | 0 | 1 | 0 |
| 0 | 1 | 0 | 1 |
| 0 | 1 | 1 | 1 |
| 1 | 0 | 0 | 1 |
| 1 | 0 | 1 | 1 |
| 1 | 1 | 0 | 1 |
| 1 | 1 | 1 | 1 |

1524

| a1 | a2 | b | z |
|---|---|---|---|
| 0 | 0 | 0 | 0 |
| 0 | 0 | 1 | 1 |
| 0 | 1 | 0 | 1 |
| 0 | 1 | 1 | 1 |
| 1 | 0 | 0 | 1 |
| 1 | 0 | 1 | 1 |
| 1 | 1 | 0 | 1 |
| 1 | 1 | 1 | 1 |

1506

| a1 | a2 | b1 | b2 | z |
|---|---|---|---|---|
| 0 | 0 | 0 | 0 | 0 |
| 0 | 0 | 0 | 1 | 1 |
| 0 | 0 | 1 | 0 | 1 |
| 0 | 0 | 1 | 1 | 1 |
| 0 | 1 | 0 | 0 | 1 |
| 0 | 1 | 0 | 1 | 1 |
| 0 | 1 | 1 | 0 | 1 |
| 0 | 1 | 1 | 1 | 1 |
| 1 | 0 | 0 | 0 | 1 |
| 1 | 0 | 0 | 1 | 1 |
| 1 | 0 | 1 | 0 | 1 |
| 1 | 0 | 1 | 1 | 1 |
| 1 | 1 | 0 | 0 | 1 |
| 1 | 1 | 0 | 1 | 1 |
| 1 | 1 | 1 | 0 | 1 |
| 1 | 1 | 1 | 1 | 1 |

1518

| a1 | a2 | b | z |
|---|---|---|---|
| 0 | 0 | 0 | 1 |
| 0 | 0 | 1 | 0 |
| 0 | 1 | 0 | 1 |
| 0 | 1 | 1 | 1 |
| 1 | 0 | 0 | 1 |
| 1 | 0 | 1 | 1 |
| 1 | 1 | 0 | 1 |
| 1 | 1 | 1 | 0 |

1526

| a1 | a2 | b | z |
|---|---|---|---|
| 0 | 0 | 0 | 0 |
| 0 | 0 | 1 | 1 |
| 0 | 1 | 0 | 1 |
| 0 | 1 | 1 | 1 |
| 1 | 0 | 0 | 1 |
| 1 | 0 | 1 | 1 |
| 1 | 1 | 0 | 0 |
| 1 | 1 | 1 | 1 |

1520

| a | b | z |
|---|---|---|
| 0 | 0 | 1 |
| 0 | 1 | 1 |
| 1 | 0 | 1 |
| 1 | 1 | 0 |

1528

| a | b | z |
|---|---|---|
| 0 | 0 | 1 |
| 0 | 1 | 1 |
| 1 | 0 | 0 |
| 1 | 1 | 1 |

1508

| a1 | a2 | b1 | b2 | z |
|---|---|---|---|---|
| 0 | 0 | 0 | 0 | 0 |
| 0 | 0 | 0 | 1 | 1 |
| 0 | 0 | 1 | 0 | 1 |
| 0 | 0 | 1 | 1 | 0 |
| 0 | 1 | 0 | 0 | 0 |
| 0 | 1 | 0 | 1 | 1 |
| 0 | 1 | 1 | 0 | 1 |
| 0 | 1 | 1 | 1 | 0 |
| 1 | 0 | 0 | 0 | 0 |
| 1 | 0 | 0 | 1 | 1 |
| 1 | 0 | 1 | 0 | 1 |
| 1 | 0 | 1 | 1 | 0 |
| 1 | 1 | 0 | 0 | 1 |
| 1 | 1 | 0 | 1 | 1 |
| 1 | 1 | 1 | 0 | 1 |
| 1 | 1 | 1 | 1 | 1 |

1510

| a1 | a2 | b1 | b2 | z |
|---|---|---|---|---|
| 0 | 0 | 0 | 0 | 0 |
| 0 | 0 | 0 | 1 | 1 |
| 0 | 0 | 1 | 0 | 1 |
| 0 | 0 | 1 | 1 | 0 |
| 0 | 1 | 0 | 0 | 1 |
| 0 | 1 | 0 | 1 | 1 |
| 0 | 1 | 1 | 0 | 1 |
| 0 | 1 | 1 | 1 | 1 |
| 1 | 0 | 0 | 0 | 1 |
| 1 | 0 | 0 | 1 | 1 |
| 1 | 0 | 1 | 0 | 1 |
| 1 | 0 | 1 | 1 | 1 |
| 1 | 1 | 0 | 0 | 1 |
| 1 | 1 | 0 | 1 | 1 |
| 1 | 1 | 1 | 0 | 1 |
| 1 | 1 | 1 | 1 | 1 |

1512

| a1 | a2 | b1 | b2 | z |
|---|---|---|---|---|
| 0 | 0 | 0 | 0 | 0 |
| 0 | 0 | 0 | 1 | 1 |
| 0 | 0 | 1 | 0 | 1 |
| 0 | 0 | 1 | 1 | 0 |
| 0 | 1 | 0 | 0 | 1 |
| 0 | 1 | 0 | 1 | 1 |
| 0 | 1 | 1 | 0 | 1 |
| 0 | 1 | 1 | 1 | 1 |
| 1 | 0 | 0 | 0 | 1 |
| 1 | 0 | 0 | 1 | 1 |
| 1 | 0 | 1 | 0 | 1 |
| 1 | 0 | 1 | 1 | 1 |
| 1 | 1 | 0 | 0 | 0 |
| 1 | 1 | 0 | 1 | 1 |
| 1 | 1 | 1 | 0 | 1 |
| 1 | 1 | 1 | 1 | 0 |

1602

| a1 | a2 | b1 | b2 | z |
|---|---|---|---|---|
| 0 | 0 | 0 | 0 | 0 |
| 0 | 0 | 0 | 1 | 0 |
| 0 | 0 | 1 | 0 | 0 |
| 0 | 0 | 1 | 1 | 0 |
| 0 | 1 | 0 | 0 | 0 |
| 0 | 1 | 0 | 1 | 0 |
| 0 | 1 | 1 | 0 | 0 |
| 0 | 1 | 1 | 1 | 0 |
| 1 | 0 | 0 | 0 | 0 |
| 1 | 0 | 0 | 1 | 0 |
| 1 | 0 | 1 | 0 | 0 |
| 1 | 0 | 1 | 1 | 0 |
| 1 | 1 | 0 | 0 | 0 |
| 1 | 1 | 0 | 1 | 0 |
| 1 | 1 | 1 | 0 | 0 |
| 1 | 1 | 1 | 1 | 1 |

1614

| a1 | a2 | b | z |
|---|---|---|---|
| 0 | 0 | 0 | 0 |
| 0 | 0 | 1 | 0 |
| 0 | 1 | 0 | 0 |
| 0 | 1 | 1 | 0 |
| 1 | 0 | 0 | 0 |
| 1 | 0 | 1 | 0 |
| 1 | 1 | 0 | 1 |
| 1 | 1 | 1 | 0 |

1622

| a1 | a2 | b | z |
|---|---|---|---|
| 0 | 0 | 0 | 0 |
| 0 | 0 | 1 | 0 |
| 0 | 1 | 0 | 0 |
| 0 | 1 | 1 | 0 |
| 1 | 0 | 0 | 0 |
| 1 | 0 | 1 | 0 |
| 1 | 1 | 0 | 0 |
| 1 | 1 | 1 | 1 |

1604

| a1 | a2 | b1 | b2 | z |
|---|---|---|---|---|
| 0 | 0 | 0 | 0 | 0 |
| 0 | 0 | 0 | 1 | 0 |
| 0 | 0 | 1 | 0 | 0 |
| 0 | 0 | 1 | 1 | 0 |
| 0 | 1 | 0 | 0 | 0 |
| 0 | 1 | 0 | 1 | 0 |
| 0 | 1 | 1 | 0 | 0 |
| 0 | 1 | 1 | 1 | 0 |
| 1 | 0 | 0 | 0 | 0 |
| 1 | 0 | 0 | 1 | 0 |
| 1 | 0 | 1 | 0 | 0 |
| 1 | 0 | 1 | 1 | 0 |
| 1 | 1 | 0 | 0 | 0 |
| 1 | 1 | 0 | 1 | 1 |
| 1 | 1 | 1 | 0 | 1 |
| 1 | 1 | 1 | 1 | 1 |

1616

| a1 | a2 | b | z |
|---|---|---|---|
| 0 | 0 | 0 | 0 |
| 0 | 0 | 1 | 0 |
| 0 | 1 | 0 | 1 |
| 0 | 1 | 1 | 0 |
| 1 | 0 | 0 | 1 |
| 1 | 0 | 1 | 0 |
| 1 | 1 | 0 | 1 |
| 1 | 1 | 1 | 0 |

1624

| a1 | a2 | b | z |
|---|---|---|---|
| 0 | 0 | 0 | 0 |
| 0 | 0 | 1 | 0 |
| 0 | 1 | 0 | 0 |
| 0 | 1 | 1 | 1 |
| 1 | 0 | 0 | 0 |
| 1 | 0 | 1 | 1 |
| 1 | 1 | 0 | 0 |
| 1 | 1 | 1 | 1 |

1606

| a1 | a2 | b1 | b2 | z |
|---|---|---|---|---|
| 0 | 0 | 0 | 0 | 0 |
| 0 | 0 | 0 | 1 | 0 |
| 0 | 0 | 1 | 0 | 0 |
| 0 | 0 | 1 | 1 | 0 |
| 0 | 1 | 0 | 0 | 0 |
| 0 | 1 | 0 | 1 | 1 |
| 0 | 1 | 1 | 0 | 1 |
| 0 | 1 | 1 | 1 | 1 |
| 1 | 0 | 0 | 0 | 0 |
| 1 | 0 | 0 | 1 | 1 |
| 1 | 0 | 1 | 0 | 1 |
| 1 | 0 | 1 | 1 | 1 |
| 1 | 1 | 0 | 0 | 0 |
| 1 | 1 | 0 | 1 | 1 |
| 1 | 1 | 1 | 0 | 1 |
| 1 | 1 | 1 | 1 | 1 |

1618

| a1 | a2 | b | z |
|---|---|---|---|
| 0 | 0 | 0 | 0 |
| 0 | 0 | 1 | 0 |
| 0 | 1 | 0 | 1 |
| 0 | 1 | 1 | 0 |
| 1 | 0 | 0 | 1 |
| 1 | 0 | 1 | 0 |
| 1 | 1 | 0 | 0 |
| 1 | 1 | 1 | 0 |

1626

| a1 | a2 | b | z |
|---|---|---|---|
| 0 | 0 | 0 | 0 |
| 0 | 0 | 1 | 0 |
| 0 | 1 | 0 | 0 |
| 0 | 1 | 1 | 1 |
| 1 | 0 | 0 | 0 |
| 1 | 0 | 1 | 1 |
| 1 | 1 | 0 | 0 |
| 1 | 1 | 1 | 0 |

1610

| a1 | a2 | b1 | b2 | z |
|---|---|---|---|---|
| 0 | 0 | 0 | 0 | 0 |
| 0 | 0 | 0 | 1 | 0 |
| 0 | 0 | 1 | 0 | 0 |
| 0 | 0 | 1 | 1 | 0 |
| 0 | 1 | 0 | 0 | 0 |
| 0 | 1 | 0 | 1 | 1 |
| 0 | 1 | 1 | 0 | 1 |
| 0 | 1 | 1 | 1 | 0 |
| 1 | 0 | 0 | 0 | 0 |
| 1 | 0 | 0 | 1 | 1 |
| 1 | 0 | 1 | 0 | 1 |
| 1 | 0 | 1 | 1 | 0 |
| 1 | 1 | 0 | 0 | 0 |
| 1 | 1 | 0 | 1 | 1 |
| 1 | 1 | 1 | 0 | 1 |
| 1 | 1 | 1 | 1 | 0 |

1612

| a1 | a2 | b1 | b2 | z |
|---|---|---|---|---|
| 0 | 0 | 0 | 0 | 0 |
| 0 | 0 | 0 | 1 | 0 |
| 0 | 0 | 1 | 0 | 0 |
| 0 | 0 | 1 | 1 | 0 |
| 0 | 1 | 0 | 0 | 0 |
| 0 | 1 | 0 | 1 | 1 |
| 0 | 1 | 1 | 0 | 1 |
| 0 | 1 | 1 | 1 | 0 |
| 1 | 0 | 0 | 0 | 0 |
| 1 | 0 | 0 | 1 | 1 |
| 1 | 0 | 1 | 0 | 1 |
| 1 | 0 | 1 | 1 | 0 |
| 1 | 1 | 0 | 0 | 0 |
| 1 | 1 | 0 | 1 | 0 |
| 1 | 1 | 1 | 0 | 0 |
| 1 | 1 | 1 | 1 | 0 |

1608

| a1 | a2 | b1 | b2 | z |
|---|---|---|---|---|
| 0 | 0 | 0 | 0 | 0 |
| 0 | 0 | 0 | 1 | 0 |
| 0 | 0 | 1 | 0 | 0 |
| 0 | 0 | 1 | 1 | 0 |
| 0 | 1 | 0 | 0 | 0 |
| 0 | 1 | 0 | 1 | 0 |
| 0 | 1 | 1 | 0 | 0 |
| 0 | 1 | 1 | 1 | 0 |
| 1 | 0 | 0 | 0 | 0 |
| 1 | 0 | 0 | 1 | 0 |
| 1 | 0 | 1 | 0 | 0 |
| 1 | 0 | 1 | 1 | 0 |
| 1 | 1 | 0 | 0 | 0 |
| 1 | 1 | 0 | 1 | 1 |
| 1 | 1 | 1 | 0 | 1 |
| 1 | 1 | 1 | 1 | 0 |

1620

| a | b | z |
|---|---|---|
| 0 | 0 | 1 |
| 0 | 1 | 0 |
| 1 | 0 | 0 |
| 1 | 1 | 0 |

1628

| a | b | z |
|---|---|---|
| 0 | 0 | 0 |
| 0 | 1 | 1 |
| 1 | 0 | 0 |
| 1 | 1 | 0 |

EFFECTIVE SYNCHRONOUS GATES FOR RAPID SINGLE FLUX QUANTUM LOGIC

STATEMENT REGARDING FEDERALLY SPONSORED RESEARCH OR DEVELOPMENT

This invention was made with Government support under Contract No.: W911NF-14-C-0090 awarded by the Army Research Office. The Government has certain rights in this invention.

BACKGROUND

The present invention relates to the electrical, electronic, and computer arts, and more specifically, to superconducting integrated circuits.

Superconducting integrated circuits are based on Josephson-junction technologies. A Josephson junction (JJ) is a quantum mechanical device that includes two superconducting materials with another non-superconducting material (e.g., dielectric, metal, semiconductor, ferromagnet) sandwiched between them. A Josephson junction switches or generates flux when current passes through it. A Josephson junction's "critical current" is the maximum supercurrent that can exist through that Josephson junction. The critical current of a Josephson junction depends on the properties of the superconductors, and can also be affected by environmental factors like temperature and externally applied magnetic field. The Josephson junction (JJ) is the basic switching device in superconductor electronics. Josephson junctions operate in two different modes: (1) switching from zero-voltage to the voltage-state, or (2) generating single-flux quanta. The first mode of Josephson junction operation requires an AC power source. The second mode of operation is used in a type of superconducting integrated circuit called Rapid Single Flux Quantum circuitry, which uses Josephson junctions that generate single-flux-quantum pulses and revert to their initial superconducting condition. RSFQ circuits are DC powered.

Rapid Single Flux Quantum (RSFQ) logic expresses 1 and 0 bits with existence and non-existence of a Single Flux Quantum (SFQ) in a superconducting circuit loop that contains Josephson junction (JJ) devices, which work as switching elements. In RSFQ logic, an SFQ voltage pulse given to the input of a device can be transferred to the next stage only when an SFQ exists in the superconducting loop. Therefore, for synchronous operation of RSFQ logic, data input signals are used to set or clear an SFQ state for the superconducting loop, and a clock input signal is used to read or transfer the state to the next stage. Without the clock signal, it is not possible to distinguish a "0" state (where SFQ is not existing in a superconducting circuit loop) from a "1" state (where SFQ is existing in a superconducting circuit loop). The difference can be distinguished by reading the internal state with the clock input signal. Therefore, implementing conventional synchronous logic gates in RSFQ logic requires a clock input signal to each stage. By contrast, synchronous logic gates in CMOS logic, such as D-flip flop (DFF), D-latch and register, can be inserted at every few combinational gate stages. Only these synchronous gates are triggered by clock signals. No clock signal is supplied to the combinational gates. Accordingly, clock speed can be raised to be much faster (over 10 GHz) in the RSFQ logic than in the conventional CMOS logic (up to 10 GHz). Also circuit design experience and principles from CMOS are neither directly nor easily applicable to RSFQ.

SUMMARY

Principles of the invention provide techniques for effective synchronous gates for rapid single flux quantum logic. In one aspect, an exemplary superconducting multi-stage synchronous logic circuit structure includes a first clocked logic gate, a second clocked logic gate, and an unclocked logic gate. Each of the logic gates includes Josephson junctions. The first clocked logic gate has a single first clocked logic gate output; the second clocked logic gate has a single second clocked logic gate output. The unclocked logic gate has a first input connected in electrical communication with the first clocked logic gate output and has a second input connected in electrical communication with the second clocked logic gate output, and has a single output. The Josephson junctions of the unclocked logic gate are arranged such that, in a single clock cycle that drives the first clocked logic gate and the second clocked logic gate, the unclocked logic gate produces a single signal in response to the inputs of the first and second clocked logic gates.

Another aspect of the invention provides an exemplary method of operating a superconducting logic circuit structure, which includes first and second synchronous superconducting logic gates with their outputs tied to inputs of an asynchronous superconducting logic gate. The exemplary method includes providing a plurality of inputs to the first and second synchronous superconducting logic gates; providing clock pulses to the first and second synchronous superconducting logic gates; and receiving from an output of the asynchronous superconducting logic gate, without providing a clock pulse to the asynchronous superconducting logic gate, a signal dependent only on the plurality of inputs to the first and second synchronous superconducting logic gates.

In view of the foregoing, techniques of the present invention can provide substantial beneficial technical effects. For example, one or more embodiments provide one or more of:

Complex logic gates implemented in RSFQ technology.

Operation of complex logic functions at clock speeds in excess of 10 GHz.

Complex gates enable implementation of complex functions in a single clock cycle, which reduces clock stages in that circuit. This reduces clock latency (number of clock pulses required to obtain output data after input data is given).

Single clock cycle implementation of complex gates also reduces circuit layout size because the size of the clock tree is reduced.

Some embodiments may not have these potential advantages and these potential advantages are not necessarily required of all embodiments. These and other features and advantages of the present invention will become apparent from the following detailed description of illustrative embodiments thereof, which is to be read in connection with the accompanying drawings.

DETAILED DESCRIPTION

As far as is understood by ordinary skilled workers, rapid single flux quantum (RSFQ) logic gates require clock input, even for static gates, because each gate status can be checked with a clock signal. With the clock signal, the gate status can be distinguished “0” from “1.” In other words, each and every RSFQ logic gate latches like a flip-flop. Therefore, basically only one stage of logic can be accomplished at each clock cycle. This feature, one of many features by which RSFQ differs from conventional CMOS logic, significantly limits how many logic functions can fit between clock cycle boundaries in an RSFQ integrated circuit. Practically, no complex (more-than-two-input, or multi-stage) gate operation is currently available within one clock cycle. Therefore, the hypothetical performance merits of RSFQ logic (high speed and low power consumption) have not been implemented in current circuit designs. Additionally, in a certain type of two-input asynchronous gate (a “Confluence Buffer” or “CB”), a meta-stable (unstable and random outcome) state occurs when two input pulses arrive with a time difference that meets a meta-stable timing condition.

In exemplary embodiments, a complex gate is implemented in a single stage of synchronous gates (SA, SO, SX, SI, and/or DFF) that feed into an asynchronous gate (CB or AA), advantageously providing total operation of the complex gate within a single clock cycle. For example, in one or more embodiments, an asynchronous confluence buffer is used as a second (post-operation) stage for two synchronous gates, with a clock signal being provided only to the synchronous gates. If a CB receives SFQ pulses at both input ports (with time difference less than a minimum of meta-stable-time) or at only one (either one) of the input ports, the CB generates one SFQ pulse at its output port right away, like an asynchronous OR. Therefore, a CB can be connected as the post-operation stage of two synchronous gates, in such a way that there is no risk of a meta-stable state, because the two input signals to the CB are triggered with the same clock and with essentially the same latency, and the latency from each synchronous gate to the CB is shorter than the clock cycle. In such a configuration, the asynchronous CB combines the outputs of the two synchronous gates, thereby providing a complex synchronous gate which operates within one clock cycle. “Complex” synchronous gates include gates with mostly more than two inputs and gates that accomplish functions other than AND, OR, NOT, NAND, NOR, XOR, XNOR; i.e., “complex” synchronous RSFQ gates correspond to functions that would require multi-clock cycles in conventional RSFQ gates.

In one or more embodiments, an asynchronous AND (AA) gate is used in place of the CB.

Figure 1:
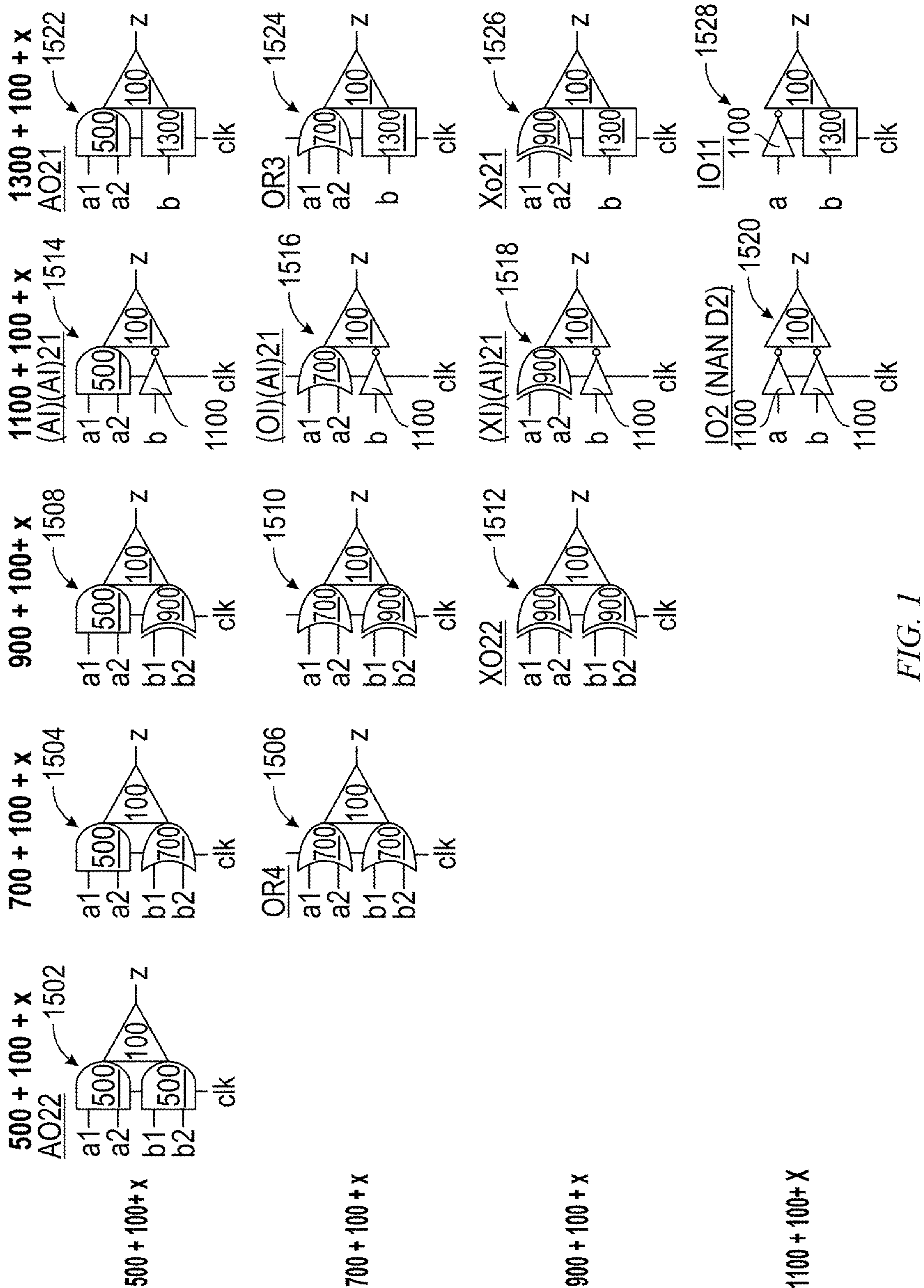
FIG. 1 illustrates in block schematics a plurality of different complex synchronous gates, according to exemplary embodiments.

FIG. 1 illustrates in block schematics a plurality of different complex synchronous gates 1502, 1504, 1506, 1508, 1510, 1512, 1514, 1516, 1518, 1520, 1522, 1524, 1526, 1528, which are formed by combinations of a confluence buffer or CB 100 (shown in FIG. 3) with one or more of a synchronous AND or SA 500 (shown in FIG. 7), a synchronous OR or SO 700 (shown in FIG. 9), a synchronous XOR or SX 900 (shown in FIG. 11), a synchronous inverter or SI 1100 (shown in FIG. 13), and/or a D-flip-flop or DFF 1300 (shown in FIG. 15), according to exemplary embodiments. Many of the different complex synchronous gates have three or more inputs; all have a single output.

Figure 2:
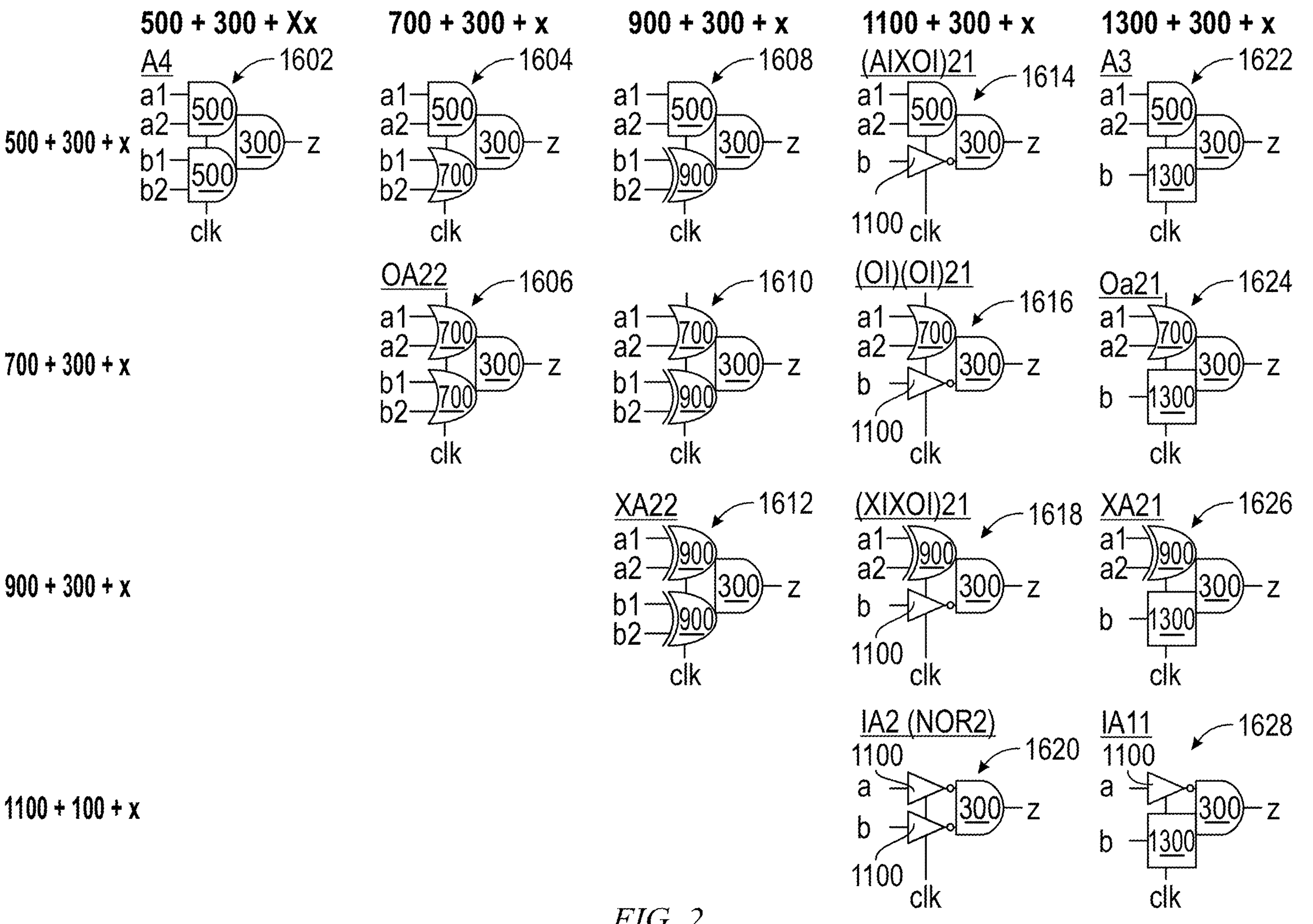
FIG. 2 illustrates in block schematics a plurality of different complex synchronous gates, according to exemplary embodiments.
Figure 19:
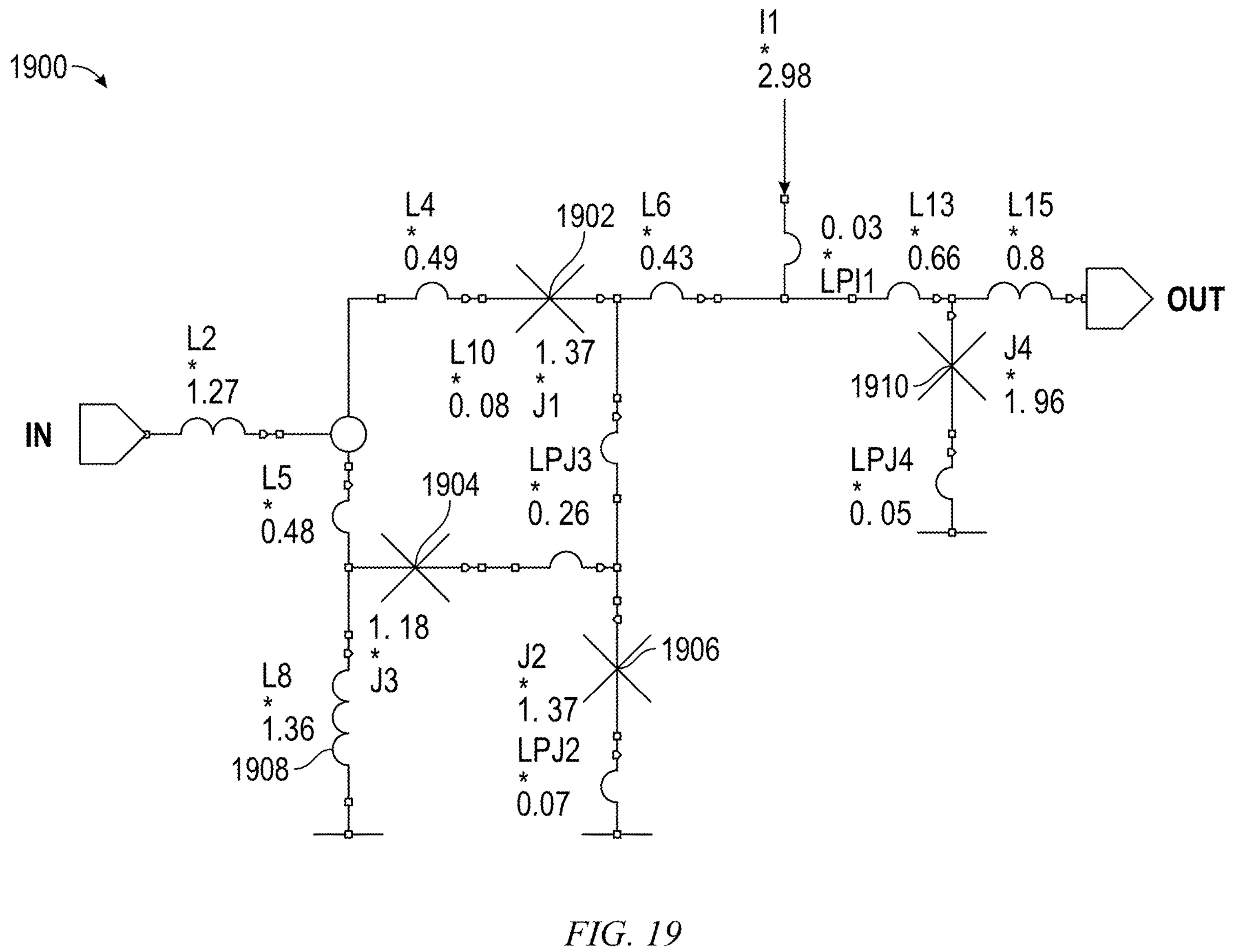
FIG. 19 shows a schematic for an SFQ clock pulse generator circuit.

Similarly, FIG. 2 illustrates in block schematics a plurality of different complex synchronous gates 1602, 1604, 1606, 1608, 1610, 1612, 1614, 1616, 1618, 1620, 1622, 1624, 1626, 1628, which are formed by combinations of an asynchronous AND or AA 300 (shown in FIG. 5) with an SA 500, SO 700, SX 900, SI 1100, and/or DFF 1300, according to exemplary embodiments. Many of the different complex synchronous gates have three or more inputs; all have a single output. In FIG. 1 and FIG. 2, the notation “clk” represents an input terminal that is connected to an SFQ clock pulse generating circuit 1900, which is shown in FIG. 19 and further described below.

Figure 3:
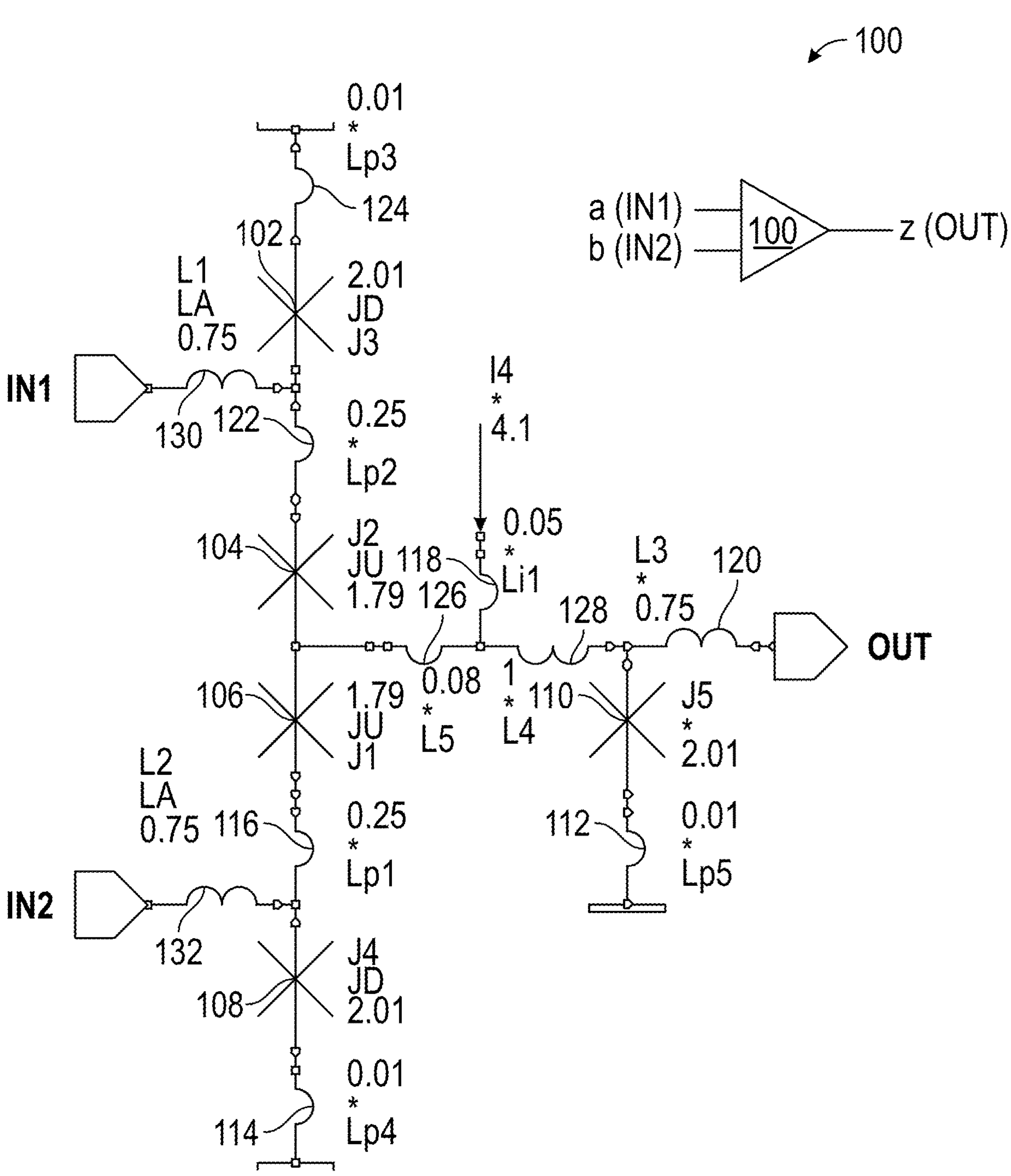
FIG. 3 illustrates in an electrical schematic a confluence buffer (CB).

FIG. 3 illustrates in an electrical schematic a confluence buffer (CB) 100 that comprises Josephson junctions 102, 104, 106, 108, 110 and inductors 112, 114, 116, 118, 120, 122, 124, 126, 128, 130, 132. An SFQ pulse at input “a (IN1)” switches junction 102, which in turn switches junction 110 (via the bus loop) and an output pulse is produced. Simultaneously, junction 106 switches (because it had smaller critical current than junction 108) so that the pulse from “a (IN1)” does not propagate backwards to input “b (IN2)”. Behavior of the circuit is symmetric when an input pulse arrives at “b (IN2)”. If two pulses arrive at both inputs close in time, at least one of them always propagates to the output. If only one output pulse is produced, JJ 104 (or JJ 106) does not switch.

Figure 4:
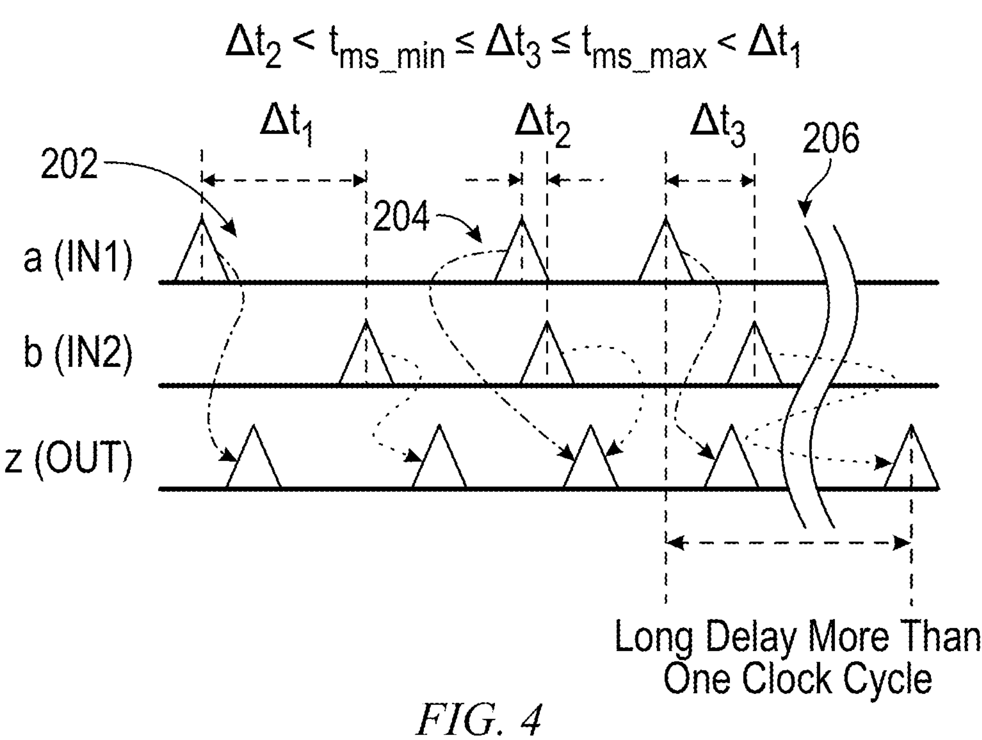
FIG. 4 shows in a graph some switching waveforms of the CB that is shown in FIG. 3.

FIG. 4 shows in a graph 200 some switching waveforms of the CB 100 that is shown in FIG. 3.

At 202, when a signal arrives at “a (IN1)” $\Delta t_1$ before another signal arrives at “b (IN2)”, the CB 100 produces two SFQ pulses at “z (OUT)”, first one for “a (IN1)” and then second one for “b (IN2).” In this case, $\Delta t_1$ is larger than a maximum “meta-stable state” time difference value; thus, $\Delta t_1$ is sufficiently long that the “z (OUT)” has been settled to ground state after a signal arrives at "a (IN1)" and before another one arrives at "b (IN2)". The right side of the equation in FIG. 4 shows this relationship. The $\Delta t_1$ is larger than $t_{ms\_max}$, where $t_{ms\_max}$ is maximum delta time of pulse arrivals at "a (IN1)" and "b (IN2)" which causes the meta-stable state condition.

At 204, a signal arrives at "a (IN1)" $\Delta t_2$ before another signal arrives at "b (IN2)." In this case, the CB 100 produces a single SFQ pulse at "z (OUT)" because the JJ 110 has not been settled to switch again after producing the SFQ pulse for the signal from "a (IN1)." As a result, the two input signals arriving at "a (IN1)" and "b (IN2)" (one for each) merge into only one input signal which arrives either at "a (IN)" or "b (IN2)." The left side of the equation in FIG. 4 shows this relationship. The $\Delta t_2$ is smaller than $t_{ms\_min}$, where $t_{ms\_min}$ is minimum delta time of pulse arrivals at "a (IN1)" and "b (IN2)" which causes meta-stable state condition.

At 206, a signal arrives at "a (IN1)" $\Delta t_3$ before another signal arrives at "b (IN2)." In this case, the CB 100 produces a first pulse at "z (OUT)" for the first-arrival signal from "a (IN1)" with normal delay, and then it produces a second pulse at "z (OUT)" for the second-arrival signal from "b (IN2)" after a considerably larger delay. If a second signal from "b (IN2)" arrives at a superconducting circuit loop 114, 108, 116, 106, 126, 128, 110, 112 at almost the same time when the JJ 110 switches to produce the pulse at "z (OUT)" for a first signal from "a (IN1)," this superconducting circuit loop gets into a meta-stable state condition. Once this superconducting circuit loop gets into the meta-stable state condition, it may take a very long time to settle and generate the next output pulse at "z (OUT)" due to the settling time of the JJ and inductor devices in the loop. The middle of the equation in FIG. 4 shows this relationship. The $\Delta t_3$ is equal or larger than $t_{ms\_min}$, where $t_{ms\_min}$ is the minimum delta time of pulse arrivals at "a (IN1)" and "b (IN2)" which causes the meta-stable state condition. Also, the $\Delta t_3$ is equal or smaller than $t_{ms\_max}$, where $t_{ms\_max}$ is the maximum delta time of pulse arrivals at "a (IN1)" and "b (IN2)" which causes the meta-stable state condition.

Because the two input ports are completely equivalent, the operation of the CB 100 is the same, even if the arriving order of the input pulses is opposite. Accordingly, the input pulse arrival nodes "a (IN1)" and "b (IN2)," the inductors "122, 124, 130" and "116, 114, 132," the JJs "102, 104" and "108, 106" can be swapped together.

Figure 5:
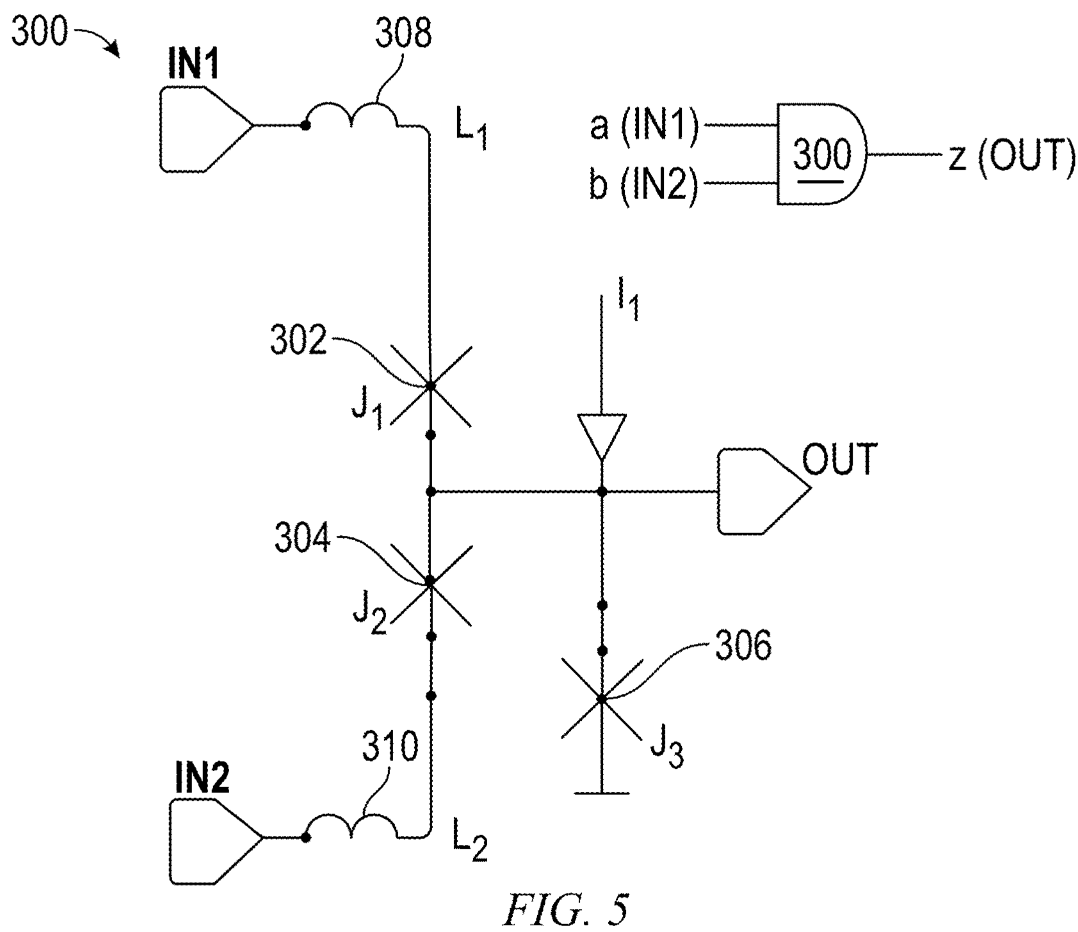
FIG. 5 illustrates in an electrical schematic an asynchronous AND gate (AA).

FIG. 5 illustrates in an electrical schematic an asynchronous AND gate (AA) 300 that comprises Josephson junctions 302, 304, 306 and inductors 308, 310. An SFQ pulse arrives at "a (IN1)" and passes through the inductor 308. An SFQ pulse arrives at "b (IN2)" and passes through the inductor 310. If both SFQ pulses arrive at "a (IN1)" and "b (IN2)" within a certain interval, the merged pulse provides enough current to switch the JJ 306, producing an SFQ pulse at "z (OUT)." Otherwise, the SFQ pulse arrives at "a (IN1)" and switches JJ 302, producing no SFQ pulse at "z (OUT)," or the SFQ pulse arrives at "b (IN2)" and switches JJ 304 producing no SFQ pulse at "z (OUT)."

Figure 6:
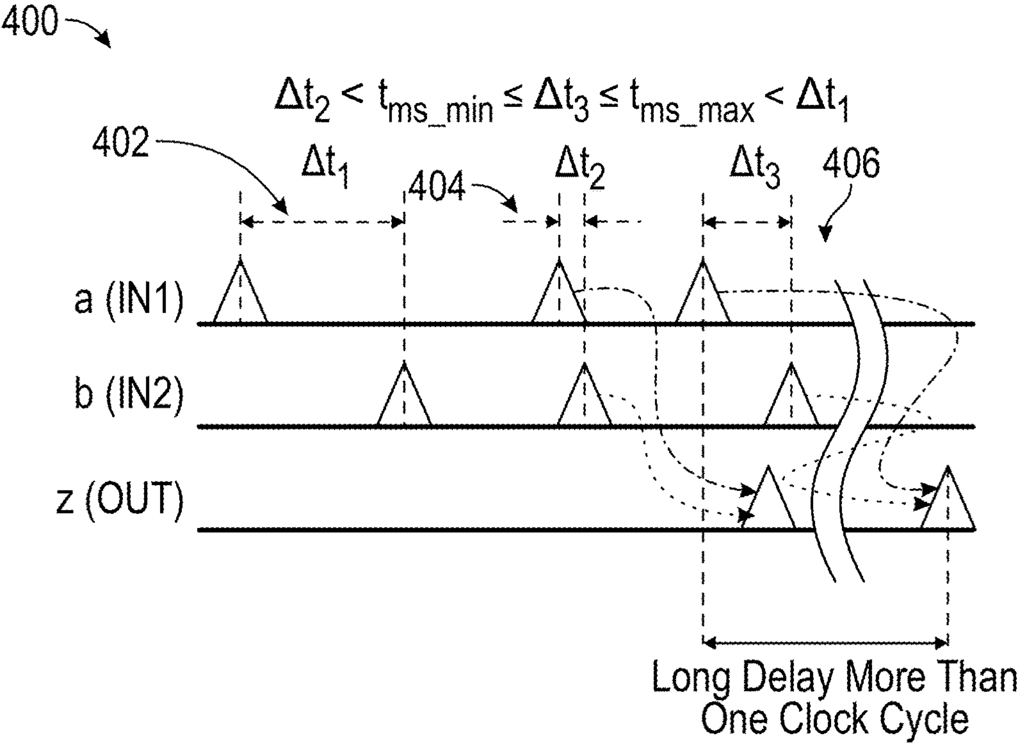
FIG. 6 shows in a graph some switching waveforms of the AA that is shown in FIG. 5.

FIG. 6 shows in a graph 400 some switching waveforms of the AA 300 that is shown in FIG. 5.

At 402, a signal arrives at "a (IN1)" $\Delta t_1$ before another signal arrives at "b (IN2)". In this case, the time delay $\Delta t_1$ is so long that the pulse at "a (IN1)" switches the JJ 302 before the pulse arrives at "b (IN2)". Then the pulse at "b (IN2)" switches the JJ 304. Therefore, the JJ 306 does not switch and there is no SFQ pulse "z" at OUT. In this case, $\Delta t_1$ is larger than a maximum "meta-stable state" time; thus, $\Delta t_1$ is sufficiently large that no pulse is produced at "z (OUT)." The right side of the equation in FIG. 6 shows this relationship. The $\Delta t_1$ is larger than $t_{ms\_max}$, where $t_{ms\_max}$ is the maximum time interval of pulse arrivals at "a (IN1)" and "b (IN2)" which causes the meta-stable state condition.

At 404, a signal arrives at "a (IN1)" $\Delta t_2$ before another signal arrives at "b (IN2)". In this case, the time delay $\Delta t_2$ is so short that the pulse at "a (IN1)" does not switch the JJ 302 before the pulse at "b (IN2)" arrives; therefore, the two input pulses merge and switch the JJ 306 and produce an SFQ pulse at "z (OUT)". In this case, $\Delta t_2$ is smaller than a minimum "meta-stable state" time; thus, $\Delta t_2$ is sufficiently short that an SFQ pulse is produced at "z (OUT)." The left side of the equation in FIG. 6 shows this relationship. The $\Delta t_2$ is smaller than $t_{ms\_min}$, where $t_{ms\_min}$ is the minimum time interval of pulse arrivals at "a (IN1)" and "b (IN2)" which causes the meta-stable state condition.

At 406, a signal arrives at "a (IN1)" Ata before another signal arrives at "b (IN2)." In this case, the AA 300 produces a single pulse at "z (OUT)" for both signals from "a (IN1)" and "b (IN2)" with considerably larger delay. If a second signal from "b (IN2)" arrives at a superconducting circuit loop just before the JJ 302 switches to escape a first pulse at "a (IN1)," this superconducting circuit loop enters into a meta-stable state condition. Once this superconducting circuit loop enters into the meta-stable state condition, it may take a very long time to generate the output pulse at "z (OUT)" due to the settling time of the JJ and inductor devices in the loop.

Because the two input ports are completely equivalent, the operation of the AA 300 is the same, even if the arriving order of the input pulses is opposite. Thus, if the input pulse arrival nodes "a (IN1)" and "b (IN2)," the inductors 308 and 310, the JJs 302 and 304 can be swapped together.

Figure 7:
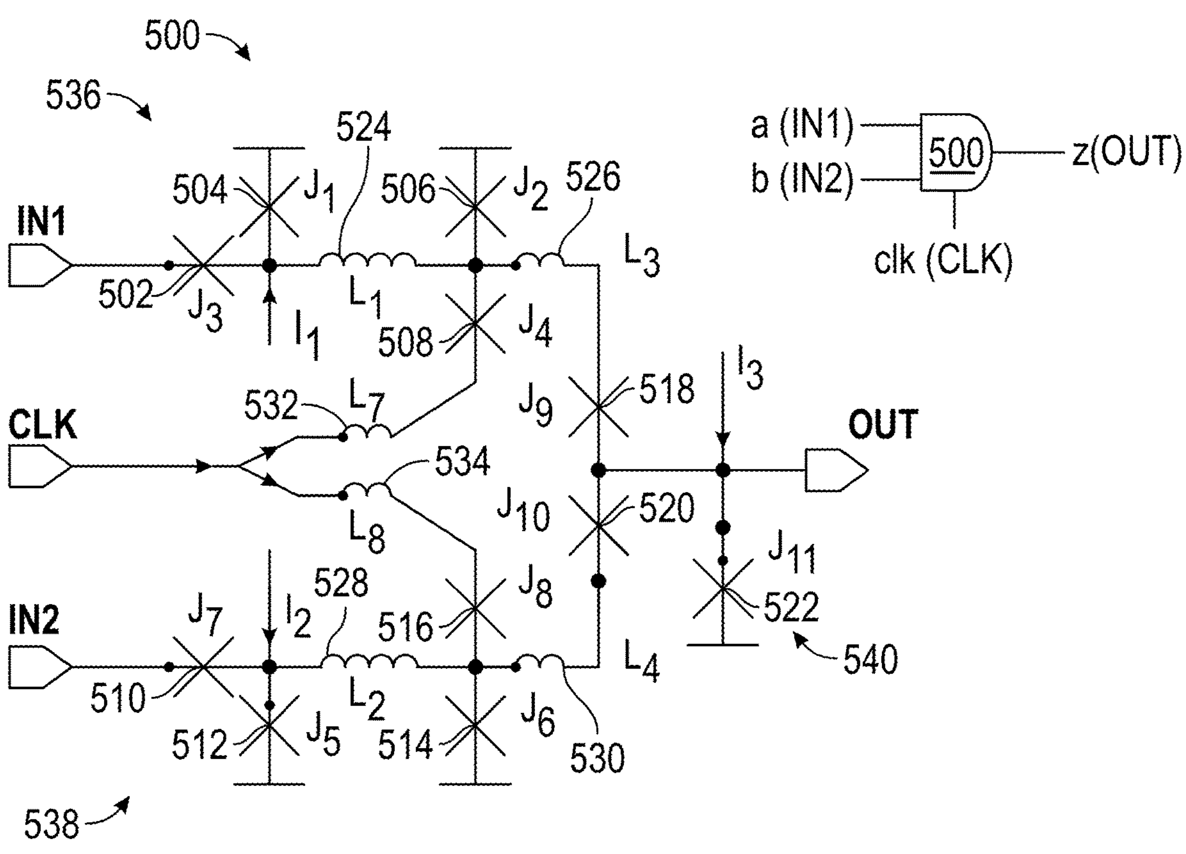
FIG. 7 illustrates in an electrical schematic a synchronous AND gate (SA).

FIG. 7 illustrates in an electrical schematic a synchronous AND gate (SA) 500 that comprises Josephson junctions 502, 504, 506, 508, 510, 512, 514, 516, 518, 520, 522 and inductors 524, 526, 528, 530, 532, 534. SA 500 is essentially a combination of two DFF (DFF 536, with input at "a (IN1)", is formed by Josephson junctions 502, 504, 506, 508 and quantizing inductance 524; and DFF 538, with input at "b (IN2)", is formed by JJ 510, 512, 514, 516 and inductor 528) and an asynchronous AND (AA) 540 formed by the three Josephson junctions 518, 520, 522. Inductors 526 and 530 connect DFFs 536 and 538 to AA 540, respectively. Inductors 532, 534 are placed to transfer split clock signals from "clk (CLK)" to switch both DFFs simultaneously, i.e., within the same clock cycle.

In operation of SA 500, the clock signal at "clk (CLK)" reads out the contents of each DFF 536, 538 into a non-quantizing loop (e.g., one formed by JJ 506, inductor 526, JJ 518, and JJ 522). If only one DFF was in state "1," it gives a flux quantum into the non-quantizing loop; then the series junction (e.g., 518) is switched, and the flux falls out of the loop without giving any output signal. However, if both DFFs were in state "1," they give fluxes into both non-quantizing loops simultaneously. In this case, the induced currents in JJ 522 add up, and this junction is switched before either of JJ 518, 520 have enough time to switch. Switching JJ 522 produces an output pulse at "z (OUT)" across this junction and also quenches switching of JJ 518, 520.

Figure 8:
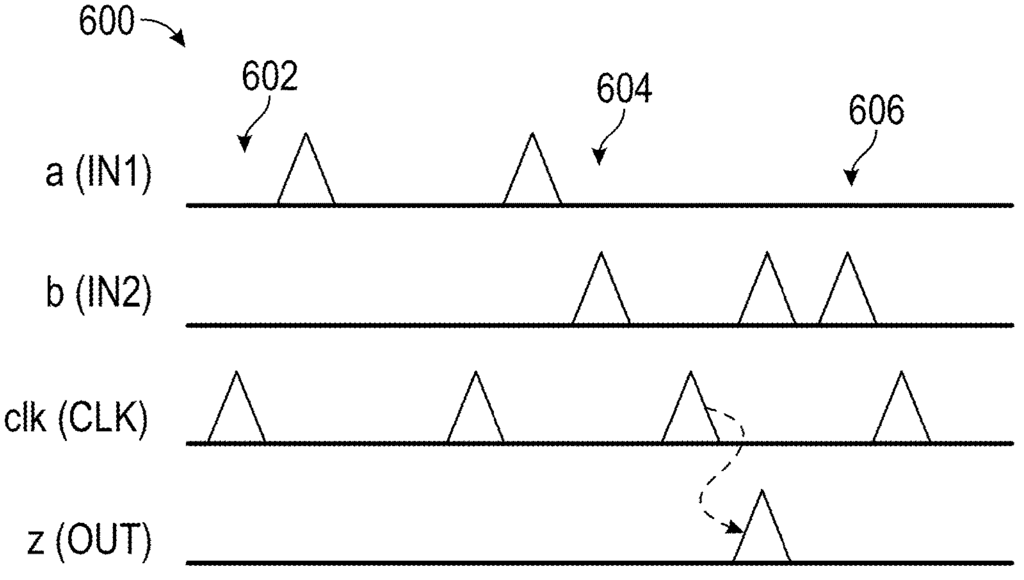
FIG. 8 shows in a graph some switching waveforms of the SA that is shown in FIG. 7.

FIG. 8 shows in a graph 600 some switching waveforms of the SA 500 that is shown in FIG. 7.

At 602, an SFQ pulse arrives at "a (IN1)" and sets DFF 536 to state "1." DFF 538 stays in state "0" because there is no input SFQ pulse at "b (IN2)" before a clock pulse supplied at "clk (CLK)." Then, a clock pulse supplied at "clk (CLK)" flushes the DFF 536 and the DFF 538 (which was not set) to AA 540. The single pulse only from the DFF 536 to AA 540 does not switch JJ 522 and no pulse is produced at "z (OUT)" (only the JJ 518 switches).

At 604, an SFQ pulse arrives at "a (IN1)" and then an SFQ pulse arrives at "b (IN2)." These pulses set both DFF 536 and DFF 538 to state "1." Then, "clk" flushes both set DFFs 536, 538 to AA 540. The two pulses switch output JJ 522 of AA 540 to produce a pulse at "z (OUT)."

At 606, two pulses arrive sequentially at "b (IN2)" and only the DFF 538 is set to the "1" state because $2^{nd}$ or later pulses do not change the state of the DFF 538. Then, "clk" flushes the superconducting circuit loop in the DFFs 536, 538 to AA 540. With only one input pulse from the DFF 538, the JJ 520 switches and the JJ 522 does not switch. Therefore, no output pulse is produced at "z (OUT)."

Figures 9, 10:
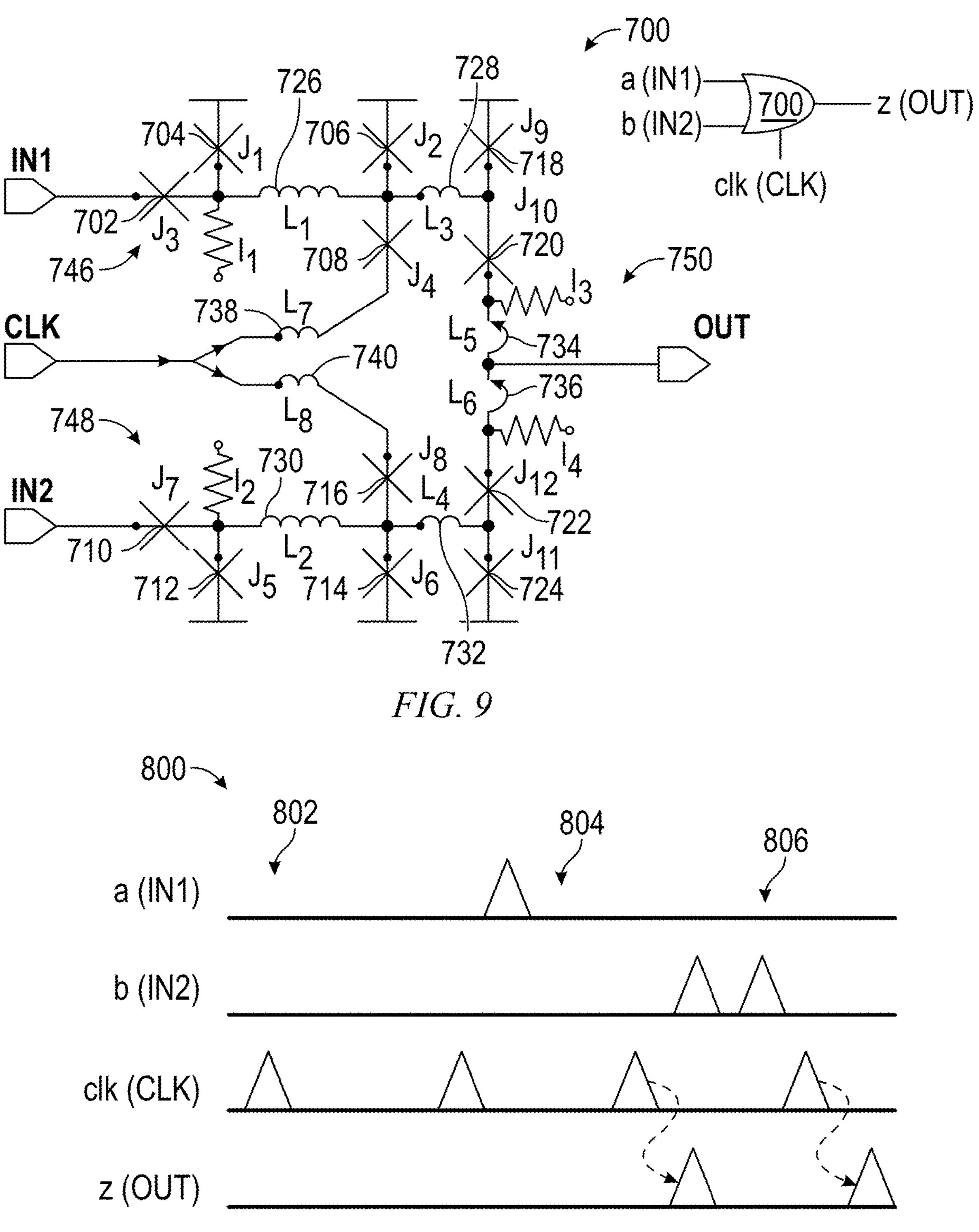
FIG. 9 illustrates in an electrical schematic a synchronous OR gate (SO).
FIG. 10 shows in a graph some switching waveforms of the SO that is shown in FIG. 9.

FIG. 9 illustrates in an electrical schematic a synchronous OR gate (SO) 700 that comprises Josephson junctions 702, 704, 706, 708, 710, 712, 714, 716, 718, 720, 722, 724 and inductors 726, 728, 730, 732, 734, 736, 738, 740. Note that the JJ 702, 704, 706, 708, along with inductors 726, 728, form a first DFF 746; the JJ 710, 712, 714, 716, along with inductors 730, 732, form a second DFF 748; and JJ 718, 720, 722, 724, along with inductors 734, 736, form a merger 750. In operation of SO 700, an SFQ pulse received at "a (IN1)" sets DFF 746 to state "1," and/or an SFQ pulse received at "b (IN2)" sets DFF 748 to state "1." Then, the clock pulse at "clk (CLK)," via inductors 738, 740, flushes the two DFFs' states to the merger 750. The merger 750 outputs an SFQ pulse to "z (OUT)" if the state of either one or both DFFs 746, 748 is or are state "1."

FIG. 10 shows in a graph 800 some switching waveforms of the SO 700 that is shown in FIG. 9.

At 802, there is no SFQ pulse at "a (IN1)" or at "b (IN2)" between "clk" pulses. Therefore, no pulse is produced at "z (OUT)" following the second "clk" pulse.

At 804, an SFQ pulse at "a (IN1)" sets the first DFF 746 to state "1." Then, an SFQ pulse at "clk (CLK)" transfers the states of the first DFF 746 and the empty second DFF 748 to the merger 750, which immediately produces an SFQ pulse at "z (OUT)."

Similarly, at 806, a first SFQ pulse at "b (IN2)" set the DFF 748 to state "1." A second pulse at "b (IN2)" has no further effect. Then, an SFQ pulse at "clk (CLK)" transfers the state of the empty first DFF 746 and the second DFF 748 to the merger 750, which immediately produces an SFQ pulse at "z (OUT)."

Figures 11, 12:
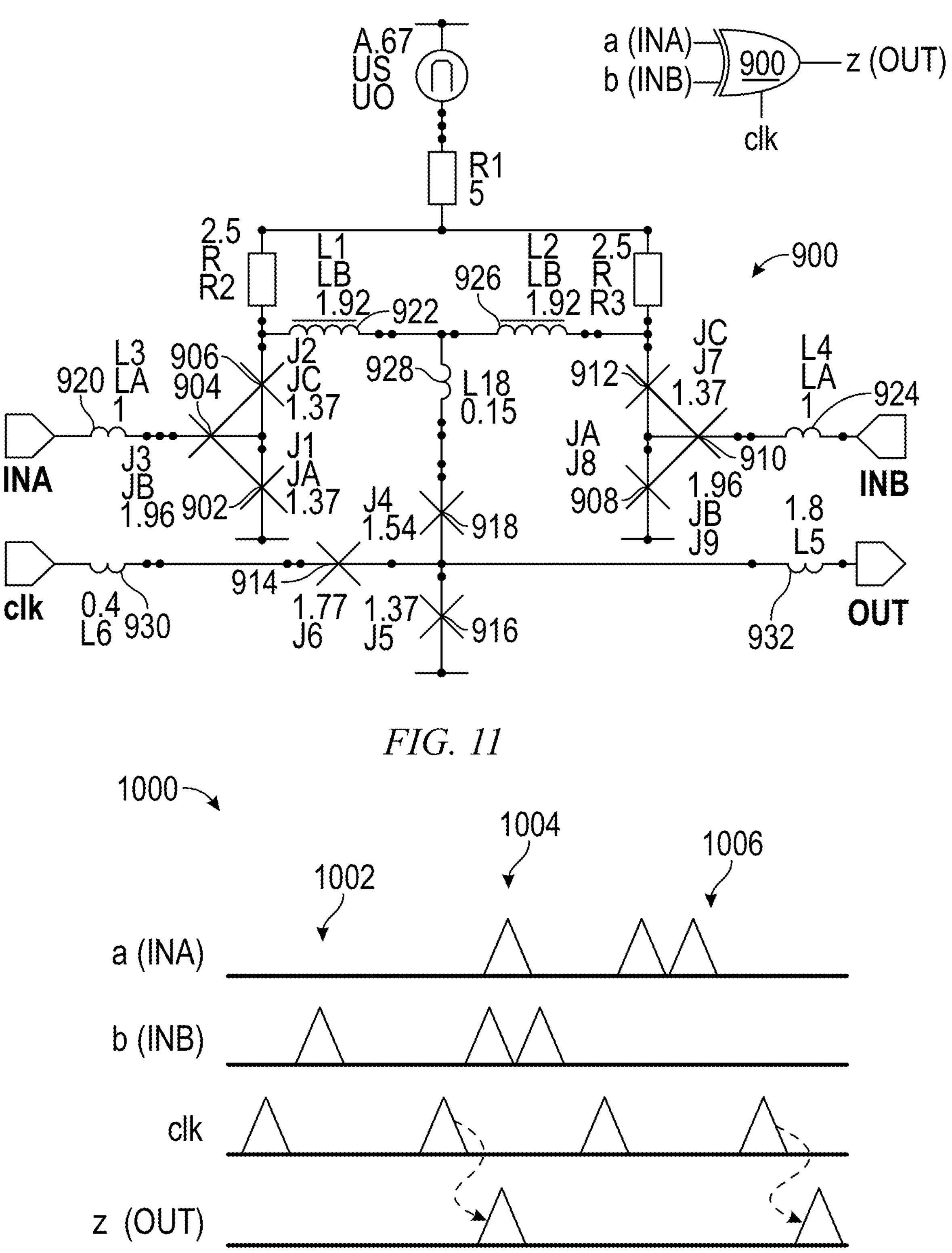
FIG. 11 illustrates in an electrical schematic a synchronous XOR gate (SX).
FIG. 12 shows in a graph some switching waveforms of the SX that is shown in FIG. 11.

FIG. 11 illustrates in an electrical schematic a synchronous XOR gate (SX) 900 that comprises Josephson junctions 902, 904, 906, 908, 910, 912, 914, 916, 918 and inductors 920, 922, 924, 926, 928, 930, 932.

In operation of the SX 900, an input SFQ pulse enters at "a (inA)" through junction 904 and is stored in the quantizing loop 902-906-922-928-918-916, or loop "A." Similarly, an SFQ pulse applied to "b (inB)" enters through junction 910 and is stored in loop "B": 908-912-926-928-918-916. When both loop "A" and loop "B" are empty, the incoming clock pulse "clk" induces a 2*Pi phase leap in junction 914 and there is no output; this is the 0+0=0 function (here "+" stands for the modulo 2 addition operator, or XOR). When there was only one input pulse before the clock, the current through the quantizing inductance of one of the loops biases the two-junction comparator 916-918 so that the next clock pulse flips junction 916 (rather than 914) to produce an SFQ pulse at "out" through inductor 932. In other words, 1+0=0+1=1. The output SFQ voltage pulse across JJ 916 clears the loop which contained the flux quantum and is at the same time applied to the empty loop. The buffer junctions 906 and 912 prevent junctions 902 and 908 from flipping (and thus injecting parasitic backward-moving SFQ pulses into the input circuits) when the output pulse is generated.

The slowest and most untrivial operation is 1+1=0. It is performed by junction 918, which flips when both quantizing loops have an SFQ inside. This process starts asynchronously, as soon as both "A" and "B" are in, and has to be completed by the arrival of the clock signal. Ideally, when the clock pulse arrives, it finds the gate in the same state as in the case of zero inputs. Junctions 904 and 910 are optional, they serve as buffers in case two or more pulses arrive at "a (inA)" or "b (inB)" before the clock pulse.

FIG. 12 shows in a graph 1000 some switching waveforms of the SX 900 that is shown in FIG. 11.

At 1002, one pulse arrives at "b (inB)" but no pulse arrives at "a (inA)" before "clk:" "z" is produced at "out." At 1004, one pulse arrives at "a (inA)" and two pulses arrive at "b (inB)" before "clk:" no pulse is produced at "z (out)." At 1006, two pulses arrive at "a (inA)" but no pulse arrives at "b (inB)" before "clk:" and a pulse is produced at "z (out)."

Figure 13:
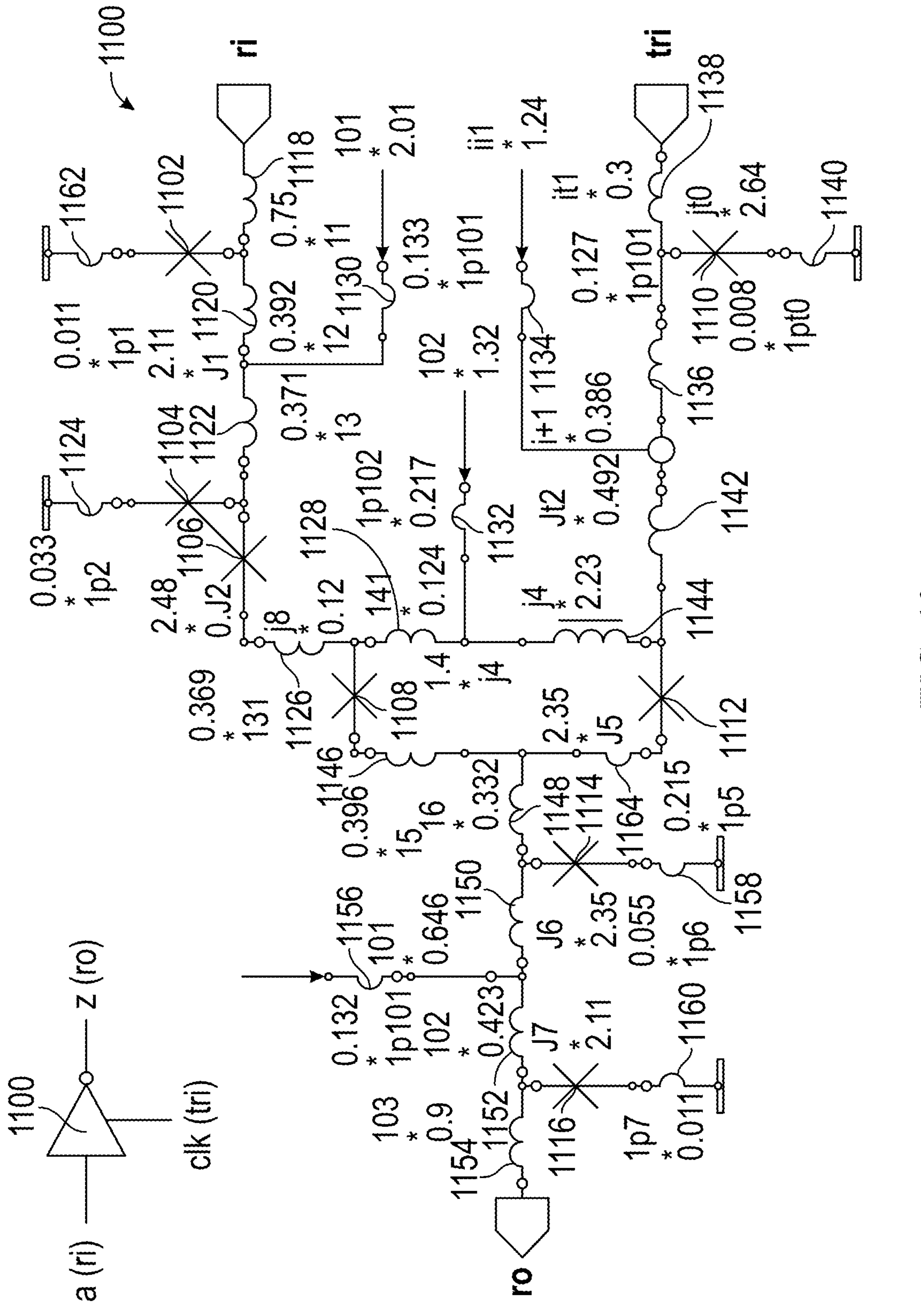
FIG. 13 illustrates in an electrical schematic a synchronous inverter (SI)

FIG. 13 illustrates in an electrical schematic a synchronous inverter (SI) 1100 that comprises Josephson junctions 1102, 1104, 1106, 1108, 1110, 1112, 1114, 1116, and inductors 1118, 1120, 1122, 1124, 1126, 1128, 1130, 1132, 1134, 1136, 1138, 1140, 1142, 1144, 1146, 1148, 1150, 1152, 1154, 1156, 1158, 1160, 1162, 1164.

In operation of the SI 1100, when a data pulse arrives at input "a (ri)" it propagates through junctions 1102, 1104 and switches junction 1108. Inductance 1144 is sufficiently large so that an SFQ is stored in the loop 1108-1128-1144-1112-1164-1146. Subsequent data pulses cannot enter the loop through 1108, and instead switch junction 1106. When a clock pulse arrives at "clk (tri)" it propagates through junction 1110 and switches either junction 1112 or junction 1114. If an SFQ is stored in the loop, junction 1112 switches and no pulse is produced at "z (ro)," otherwise junctions 1114 and 1116 switch and produce an output pulse at "z (ro)."

When there is no SFQ stored in the loop 1108-1128-1144-1112-1164-1146, there is no loop current in this loop. However, the part of the bias current flowing through the inductor 1132 flows right to left on the JJ 1108 and left to right on the JJ 1106. This current flows in the same direction of the current induced by an incoming SFQ pulse from "a (ri)" for the JJ 1108, while it is the opposite direction for the JJ 1106. Therefore, the JJ 1108 switches more easily than the JJ 1106 does. When there is an SFQ stored in this loop, the current direction of the stored SFQ (clock-wise direction) is the opposite of the above bias current for the JJ 1108. Then, the next incoming SFQ pulse switches the JJ 1106 but not the JJ 1108, because the JJ 1108 becomes harder to switch than the JJ 1106. A similar explanation can be done for the JJ 1112 and the JJ 1114. When there is an SFQ stored in the above loop, the current direction of the loop current is the same as that of the current induced by an incoming pulse from "clk (tri)." Therefore, the JJ 1112 become easier to switch than the JJ 1114. As a result, the stored state is cleared by the JJ 1112's switching and no output pulse is produced at "z (ro)." However, when there is no SFQ stored in the loop, the current flowing through the JJ 1112 is not enough to cause the JJ 1112 to switch when it receives an incoming SFQ pulse from "clk (tri)." Then the JJ 1112 becomes harder to switch than the JJ 1114. As a result, an output pulse is produced at "z (ro)."

Figure 14:
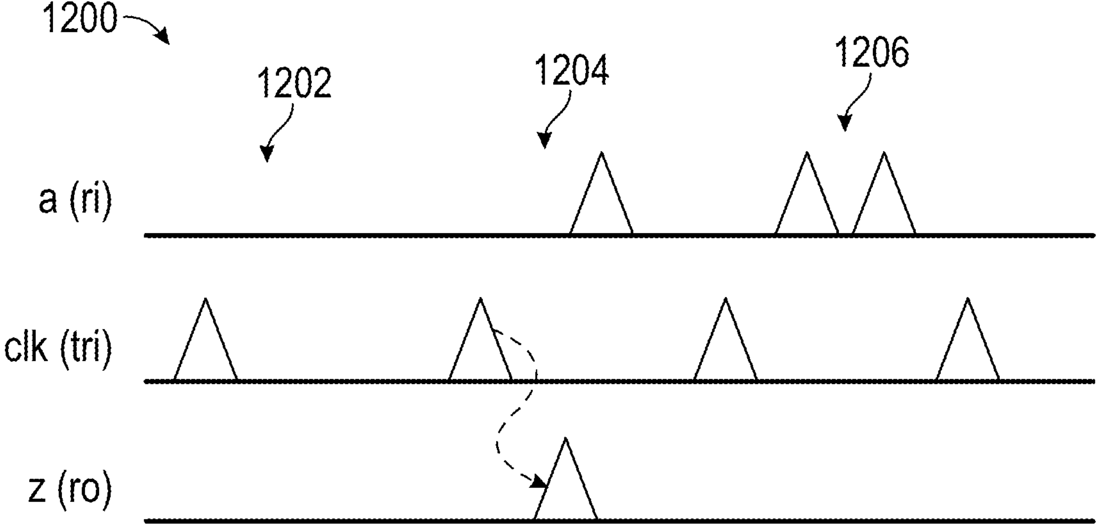
FIG. 14 shows in a graph some switching waveforms of the SI that is shown in FIG. 13.

FIG. 14 shows in a graph 1200 some switching waveforms of the SI 1100 that is shown in FIG. 13. At 1202, there is no pulse at "a (ri)" so that an output pulse is produced at "z (ro)." At 1204, there is a single pulse at "a (ri)" so that no output pulse at "z (ro)" is produced. At 1206, there are two SFQ input pulses at "a (ri)." The first pulse causes an SFQ stored in the loop 1108-1128-1144-1112-1164-1146. The second pulse switches the JJ 1106 and the SFQ in above loop is kept. Thus no output pulse is generated at "z (ro)" after the input pulse at "clk (tri)."

Figures 15, 16:
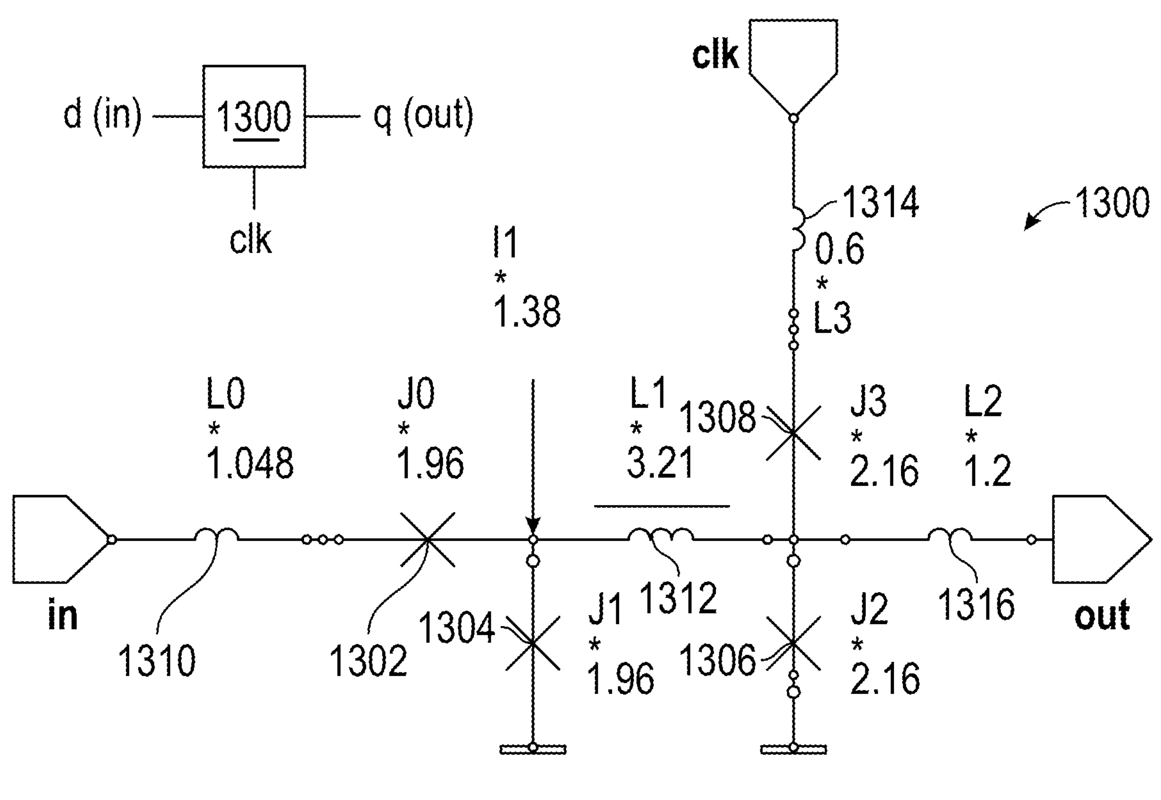
FIG. 15 illustrates in an electrical schematic a D-flip flop (DFF).
FIG. 16 shows in a graph some switching waveforms of the DFF that is shown in FIG. 15.

FIG. 15 illustrates in an electrical schematic a D-flip flop (DFF) 1300 that comprises Josephson junctions 1302, 1304, 1306, 1308 and inductors 1310, 1312, 1314, 1316. It is built around a DC SQUID 1304-1312-1306, which has two stable states: "1" and "0," i.e. with and without a magnetic flux quantum inside. A SQUID (superconducting quantum interference device) is a very sensitive magnetometer, used to measure extremely subtle magnetic fields, that is based on a superconducting loop containing Josephson junctions. In state "0," an SFQ voltage pulse applied to the input "d (in)" enters the SQUID 1304-1312-1306 through junction 1304 and is stored inside as state "1," in which the dc current in the quantizing loop flows clockwise and as a result the junction 1304 is biased very far from its critical current value. If another SFQ pulse is applied to the input "d (in)," it flips the junction 1302 and the latch remains in state "1." If, instead, an SFQ pulse enters at "clk" input when the latch is in state "1," the junction 1306 would flip, releasing the stored flux quantum and thus clearing the quantizing loop and a pulse is produced at "q (out)" through the inductor 1316. In state "0," junction 1308 is closer than junction 1306 to its threshold value, so that an SFQ pulse to "clk" flips junction 1308 and the latch remains in state "0" and no pulse is produced at "q (out)."

FIG. 16 shows in a graph 1400 some switching waveforms of the DFF 1300 that is shown in FIG. 15. At 1402, no pulse arrives at "d (in)"; therefore, the clock pulse at "clk" does not cause any pulse at "q (out)." At 1404, a pulse arrives at "d (in)," then the clock pulse arrives at "clk" and causes a pulse at "q (out)" while clearing the state of the DFF 1300. At 1406, two pulses arrive at "d (in)"; the first one sets the DFF 1300, the second only flips the junction 1302 and does not change state of the DFF. Then, a clock pulse arrives at "clk" and triggers a pulse to "q (out)."

Figure 17A:
FIGS. 17A-17B show logic tables for the complex gates that are shown in FIG. 1.
Figure 17B:
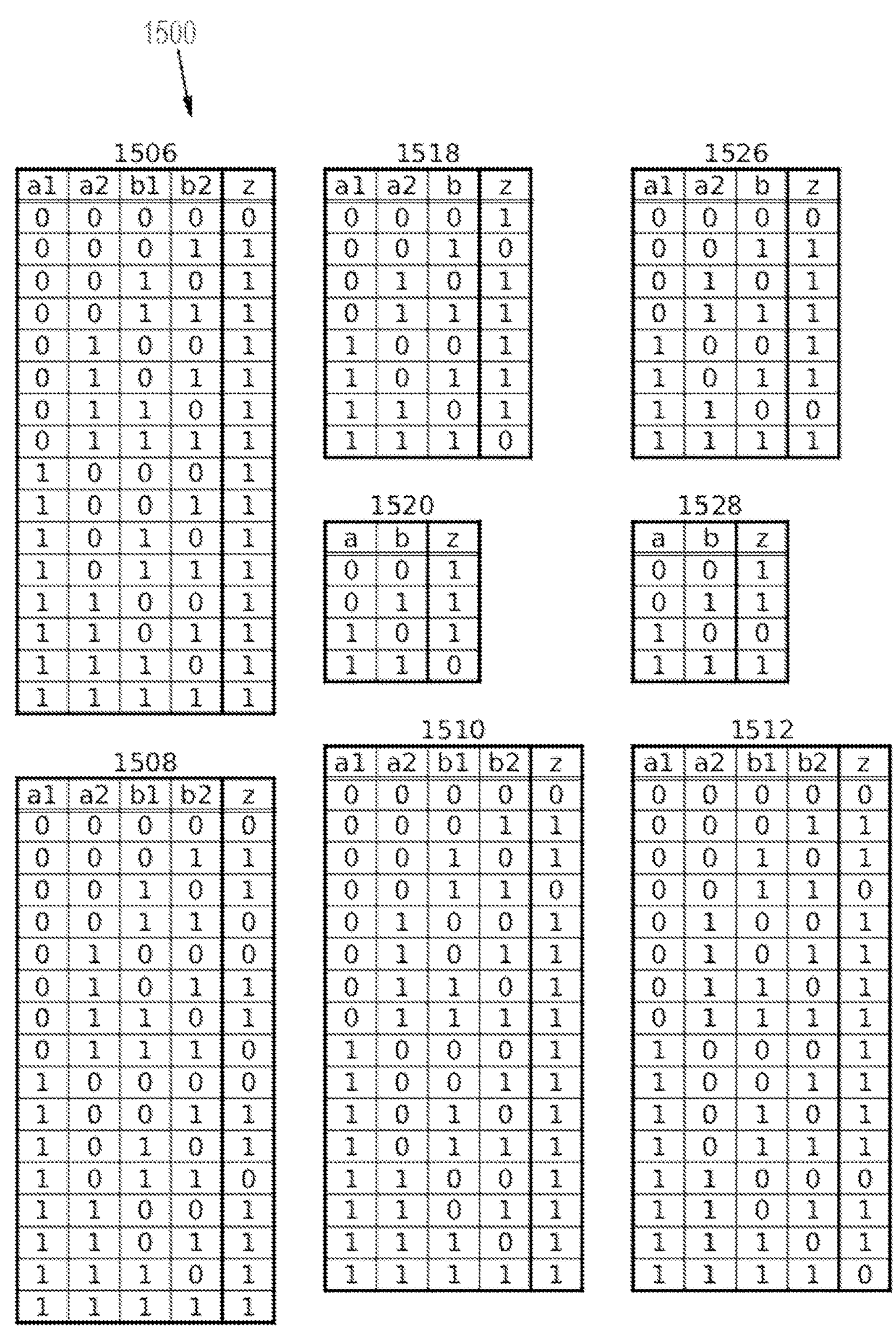

FIGS. 17A and 17B show truth tables or logic tables 1500 for the complex gates that are shown in FIG. 1.

Figure 18A:
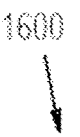
FIGS. 18A-18B show logic tables for the complex gates that are shown in FIG. 2.
Figure 18B:
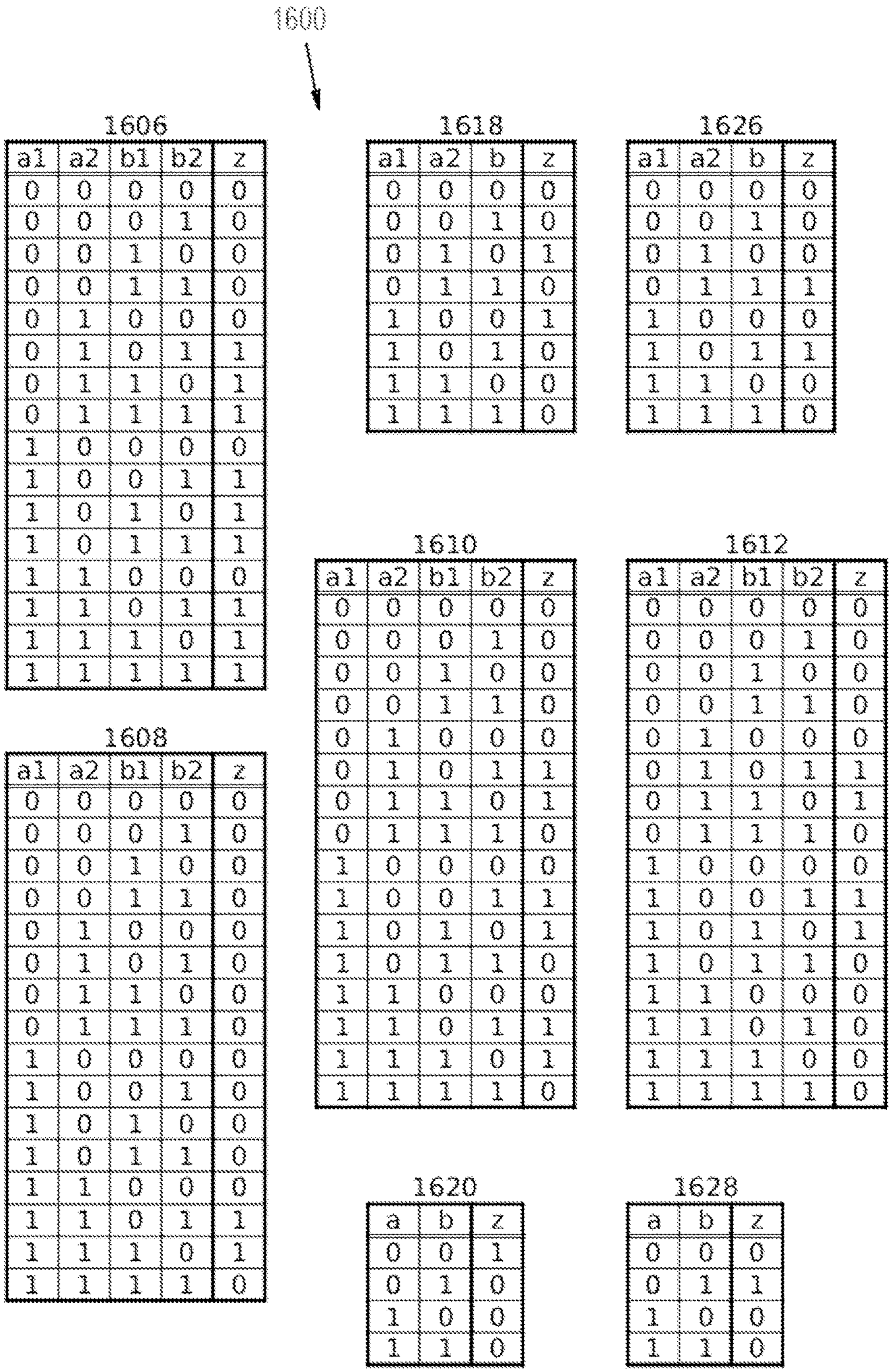

FIGS. 18A and 18B show truth tables or logic tables 1600 for the complex gates that are shown in FIG. 2.

FIG. 19 shows in a schematic an SFQ clock pulse generating circuit (clock circuit) 1900. The ordinary skilled worker is generally familiar with SFQ clock pulse generation; however, the following review may be convenient. The clock circuit 1900 includes JJ 1902, 1904, 1906, 1910 and a relatively large inductor 1908 (with inductance L8). JJ 1902, 1904 in combination with their adjacent small inductors act as a single JJ, which forms with JJ 1906 and inductor 1908 a DC SQUID (SQUIDs are familiar to the ordinary skilled worker as components of Magnetic Resonance Imaging (MRI) equipment), in which DC current circulates clockwise from IN. When the input current is increased above a certain value, the dc current through JJ 1906 exceeds its critical value and the junction flips, generating a flux-antiflux pair of magnitude F0. The flux quantum moves to OUT, while the antiflux is captured in the quantizing loop of the SQUID. This immediately changes the dc current inside the SQUID (approximately, by F0/L8) and the current through JJ 1906 is reduced below the critical value. Accordingly, a single picosecond SFQ pulse can be generated on-chip by applying a slowly changing, noisy and inexact (e.g., within a window of F0/L8=0.5 mA) dc current from a room-temperature current source. Similarly, when the input current is decreased below a certain value, the split junction composed by JJs 1902, 1904 flips, restoring the initial state of the SQUID. JJ 1910 is optional; it serves as a one-stage output JTL to sharpen the SFQ pulse and to match the output of the DC/SFQ converter with the load. The skilled artisan can select "relatively large" and "small" inductance values for appropriate clock pulse generating circuits.

Figure 20:
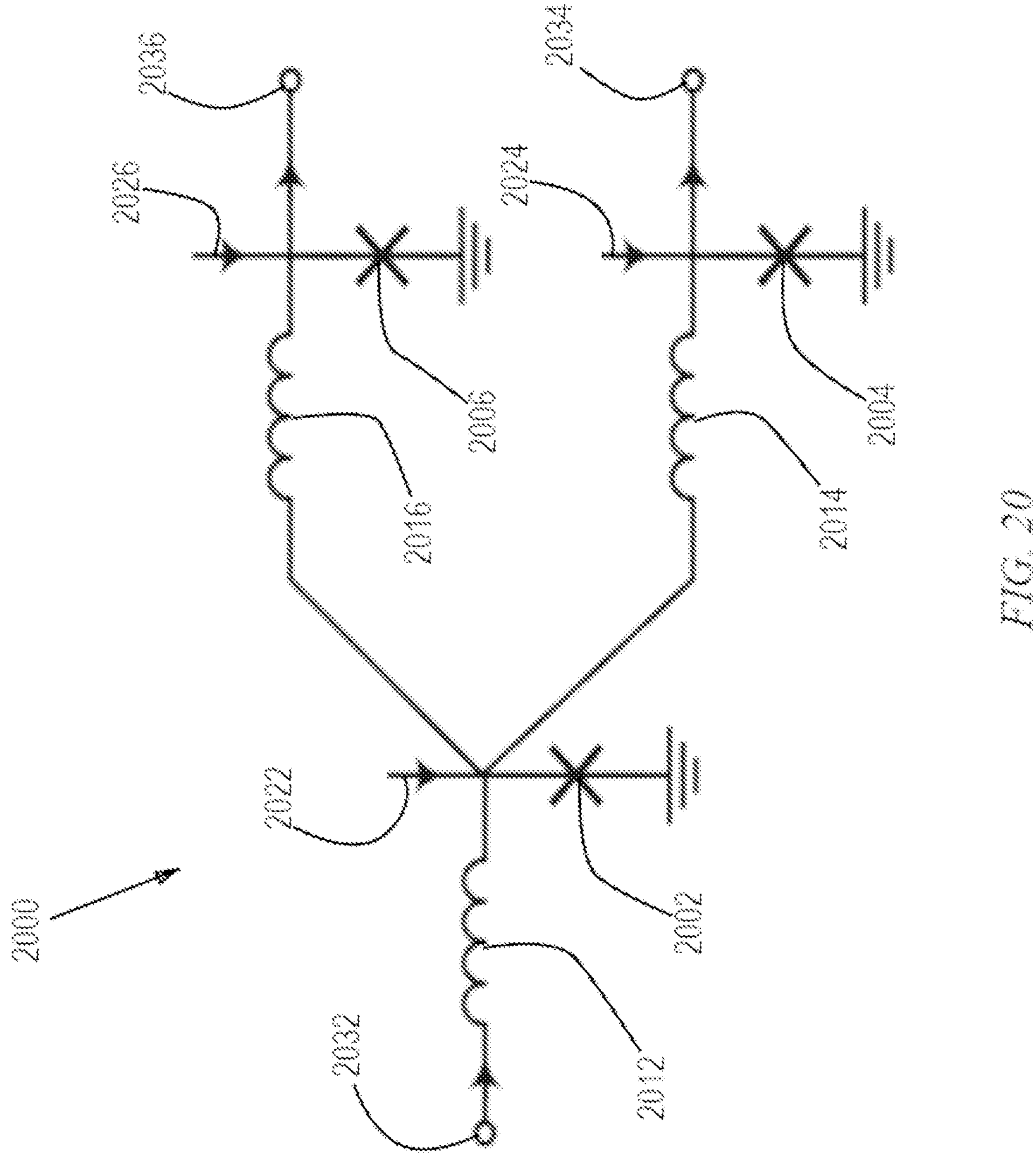
FIG. 20 shows a schematic for an SFQ clock pulse splitter.

SFQ clock pulses are distributed from the clock circuit 1900 to the various synchronous gates by means of a clock splitter tree, which is a structure familiar to the ordinary skilled worker. FIG. 20 shows an exemplary clock splitter tree 2000, which includes JJ 2002, 2004, 2006 and matching inductors 2012, 2014, 2016. Bias currents are supplied to the clock splitter tree 2000 at inputs 2022, 2024, 2026. A clock pulse is received at input 2032, and two clock pulses simultaneously are produced at outputs 2034, 2036.

Given the discussion thus far, it will be appreciated that, in general terms, an exemplary superconducting multi-stage synchronous logic circuit structure (e.g., 1510) includes a first clocked logic gate (e.g., 700), a second clocked logic gate (e.g., 900), and an unclocked logic gate (e.g., 100). Each of the logic gates includes Josephson junctions. The first clocked logic gate has a single first clocked logic gate output; the second clocked logic gate has a single second clocked logic gate output. The unclocked logic gate has a first input connected in electrical communication with the first clocked logic gate output and has a second input connected in electrical communication with the second clocked logic gate output, and has a single output. The Josephson junctions of the unclocked logic gate are arranged such that, in a single clock cycle that drives the first clocked logic gate and the second clocked logic gate, the unclocked logic gate produces a single signal in response to the inputs of the first and second clocked logic gates.

In one or more embodiments, the first clocked logic gate is a synchronous AND, and the second clocked logic gate also is a synchronous AND. In one or more embodiments, the first clocked logic gate is a synchronous OR, and the second clocked logic gate is a synchronous AND. In one or more embodiments, the first clocked logic gate is a synchronous OR, and the second clocked logic gate is a synchronous OR. In one or more embodiments, the first clocked logic gate is a synchronous XOR, and the second clocked logic gate is a synchronous AND. In one or more embodiments, the first clocked logic gate is a synchronous XOR, and the second clocked logic gate is a synchronous OR. In one or more embodiments, the first clocked logic gate is a synchronous XOR, and the second clocked logic gate is a synchronous XOR. In one or more embodiments, the first clocked logic gate is a synchronous inverter, and the second clocked logic gate is a synchronous AND. In one or more embodiments, the first clocked logic gate is a synchronous inverter, and the second clocked logic gate is a synchronous OR. In one or more embodiments, the first clocked logic gate is a synchronous inverter, and the second clocked logic gate is a synchronous XOR. In one or more embodiments, the first clocked logic gate is a synchronous D-flip-flop, and the second clocked logic gate is a synchronous AND. In one or more embodiments, the first clocked logic gate is a synchronous D-flip-flop, and the second clocked logic gate is a synchronous OR. In one or more embodiments, the first clocked logic gate is a synchronous D-flip-flop, and the second clocked logic gate is a synchronous XOR. In one or more embodiments, the unclocked logic gate is a confluence buffer. In one or more embodiments, the unclocked logic gate is an asynchronous AND.

One or more embodiments also include a clock circuit that is configured to produce an SFQ clock pulse to each of the synchronous gates.

In one or more embodiments, the first and second clocked logic gates together have three or more inputs.

Another aspect of the invention provides an exemplary method of operating a superconducting logic circuit structure, which includes first and second synchronous superconducting logic gates with their outputs tied to inputs of an asynchronous superconducting logic gate. The exemplary method includes providing a plurality of inputs to the first and second synchronous superconducting logic gates; providing clock pulses to the first and second synchronous superconducting logic gates; and receiving from an output of the asynchronous superconducting logic gate, without providing a clock pulse to the asynchronous superconducting logic gate, a signal dependent only on the plurality of inputs to the first and second synchronous superconducting logic gates. In one or more embodiments, the signal is a Boolean value that depends on Boolean values of three or more inputs to the first and second synchronous superconducting logic gates. In one or more embodiments, providing a plurality of inputs comprises providing three or more inputs after each of the first and second synchronous superconducting logic gates has received a first clock pulse and before each of the first and second synchronous superconducting logic gates receives a second clock pulse.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A superconducting multi-stage synchronous logic circuit structure, comprising:

a first clocked logic gate that comprises Josephson junctions and has a single first clocked logic gate output;

a second clocked logic gate that comprises Josephson junctions and has a single second clocked logic gate output; and an unclocked logic gate that comprises Josephson junctions and that has a first input connected in electrical communication with the first clocked logic gate output and has a second input connected in electrical communication with the second clocked logic gate output, wherein the unclocked logic gate is a confluence buffer, and wherein the Josephson junctions of the unclocked logic gate are arranged such that, in a single clock cycle that drives the first clocked logic gate and the second clocked logic gate, the unclocked logic gate produces a single signal in response to the inputs of the first and second clocked logic gates.

2. The structure of claim 1, wherein the first clocked logic gate is a synchronous AND, and the second clocked logic gate also is a synchronous AND.

3. The structure of claim 1, wherein the first clocked logic gate is a synchronous OR, and the second clocked logic gate is a synchronous AND.

4. The structure of claim 1, wherein the first clocked logic gate is a synchronous OR, and the second clocked logic gate is a synchronous OR.

5. The structure of claim 1, wherein the first clocked logic gate is a synchronous XOR, and the second clocked logic gate is a synchronous AND.

6. The structure of claim 1, wherein the first clocked logic gate is a synchronous XOR, and the second clocked logic gate is a synchronous OR.

7. The structure of claim 1, wherein the first clocked logic gate is a synchronous XOR, and the second clocked logic gate is a synchronous XOR.

8. The structure of claim 1, wherein the first clocked logic gate is a synchronous inverter, and the second clocked logic gate is a synchronous AND.

9. The structure of claim 1, wherein the first clocked logic gate is a synchronous inverter, and the second clocked logic gate is a synchronous OR.

10. The structure of claim 1, wherein the first clocked logic gate is a synchronous inverter, and the second clocked logic gate is a synchronous XOR.

11. The structure of claim 1, wherein the first clocked logic gate is a synchronous D-flip-flop, and the second clocked logic gate is a synchronous AND.

12. The structure of claim 1, wherein the first clocked logic gate is a synchronous D-flip-flop, and the second clocked logic gate is a synchronous OR.

13. The structure of claim 1, wherein the first clocked logic gate is a synchronous D-flip-flop, and the second clocked logic gate is a synchronous XOR.

14. The structure of claim 1, wherein the unclocked logic gate is an asynchronous AND.

15. The structure of claim 1, further comprising a clock circuit that is configured to produce an SFQ clock pulse to each of the synchronous gates.

16. The structure of claim 1, wherein the first and second clocked logic gates together have three or more inputs.

17. A method of operating a superconducting logic circuit structure, which includes first and second synchronous superconducting logic gates with their outputs tied to inputs of an asynchronous superconducting logic gate, the method comprising:

providing a plurality of inputs to the first and second synchronous superconducting logic gates, wherein the providing the plurality of inputs comprises providing three or more inputs after each of the first and second synchronous superconducting logic gates has received a first clock pulse and before each of the first and second synchronous superconducting logic gates receives a second clock pulse;

providing clock pulses to the first and second synchronous superconducting logic gates; and receiving from an output of the asynchronous superconducting logic gate, without providing a clock pulse to the asynchronous superconducting logic gate, a signal dependent only on the plurality of inputs to the first and second synchronous superconducting logic gates.

18. The method of claim 17, wherein the signal is a Boolean value that depends on Boolean values of three or more inputs to the first and second synchronous superconducting logic gates.

* * * * *